(12) United States Patent
Kuo et al.

(10) Patent No.: US 12,356,636 B2
(45) Date of Patent: Jul. 8, 2025

(54) DEEP TRENCH CAPACITOR STRUCTURE AND METHOD FOR FORMING THE SAME

(71) Applicant: TAIWAN SEMICONDUCTOR MANUFACTURING COMPANY, LTD., Hsinchu (TW)

(72) Inventors: Fu-Chiang Kuo, Hsinchu (TW); Yu-Han Chen, Yilan County (TW); Cheng-Wei Lo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 253 days.

(21) Appl. No.: 17/887,194

(22) Filed: Aug. 12, 2022

(65) Prior Publication Data
US 2024/0055470 A1  Feb. 15, 2024

(51) Int. Cl.
| H10D 1/00 | (2025.01) |
| H01L 23/522 | (2006.01) |
| H10D 1/68 | (2025.01) |

(52) U.S. Cl.
CPC ......... *H10D 1/042* (2025.01); *H01L 23/5223* (2013.01); *H01L 23/5226* (2013.01); *H10D 1/047* (2025.01); *H10D 1/696* (2025.01); *H10D 1/716* (2025.01)

(58) Field of Classification Search
CPC ............. H01L 23/5283; H01L 23/5384; H01L 23/5386; H01L 23/5226; H01L 23/5223; H01L 23/481; H01L 28/75; H01L 28/87; H01L 28/91; H01L 29/945; H01L 29/66181; H10B 12/37; H10B 12/0387; H10B 12/038; H01G 4/228; H01G 4/232; H01G 4/005; H10D 1/042; H10D 1/716
See application file for complete search history.

(56) References Cited

U.S. PATENT DOCUMENTS

| 8,802,504 B1 | 8/2014 | Hou et al. |
| 8,803,292 B2 | 8/2014 | Chen et al. |
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |

(Continued)

*Primary Examiner* — Jose R Diaz
(74) *Attorney, Agent, or Firm* — Birch, Stewart, Kolasch & Birch, LLP

(57) ABSTRACT

A method includes forming first-type deep trenches and second-type deep trenches in a substrate, in which the first-type deep trenches have a first lengthwise direction along a first direction and the second-type deep trenches have a second lengthwise direction along a second direction; forming a capacitor structure over the substrate and in the first-type deep trenches and the second-type deep trenches, in which the capacitor structure includes a first metallic electrode layer, a node dielectric layer over the first metallic electrode layer, and a second metallic electrode layer over the node dielectric layer; and forming a first metal via over the capacitor structure and in contact with the second metallic electrode layer of the capacitor structure, in which a length of the first metal via is greater than a width of the first metal via from a top view.

20 Claims, 20 Drawing Sheets

(56) References Cited

U.S. PATENT DOCUMENTS

| | | |
|---|---|---|
| 9,496,189 B2 | 11/2016 | Yu et al. |
| 9,608,130 B2 * | 3/2017 | Tran ........................ H01L 28/91 |
| 10,276,651 B2 * | 4/2019 | Lin ................... H01L 21/31053 |
| 10,546,917 B1 * | 1/2020 | Tsai .................... H01L 21/3083 |
| 2010/0181645 A1 * | 7/2010 | Marenco ................. H01L 28/60 |
| | | 257/532 |

* cited by examiner

DEEP TRENCH CAPACITOR STRUCTURE AND METHOD FOR FORMING THE SAME

BACKGROUND

In recent years, the semiconductor industry has experienced rapid growth due to continuous improvement in the integration density of a variety of electronic components (e.g., transistors, diodes, resistors, capacitors, etc.). For the most part, improvement in integration density has resulted from iterative reduction of minimum feature size, which allows more components to be integrated into a given area.

Capacitors are used in semiconductor chips for many applications such as power supply stabilization. However, a significant amount of device area is often used to fabricate such capacitors. Accordingly, capacitors that may provide high capacitance with a small device footprint are desirable.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
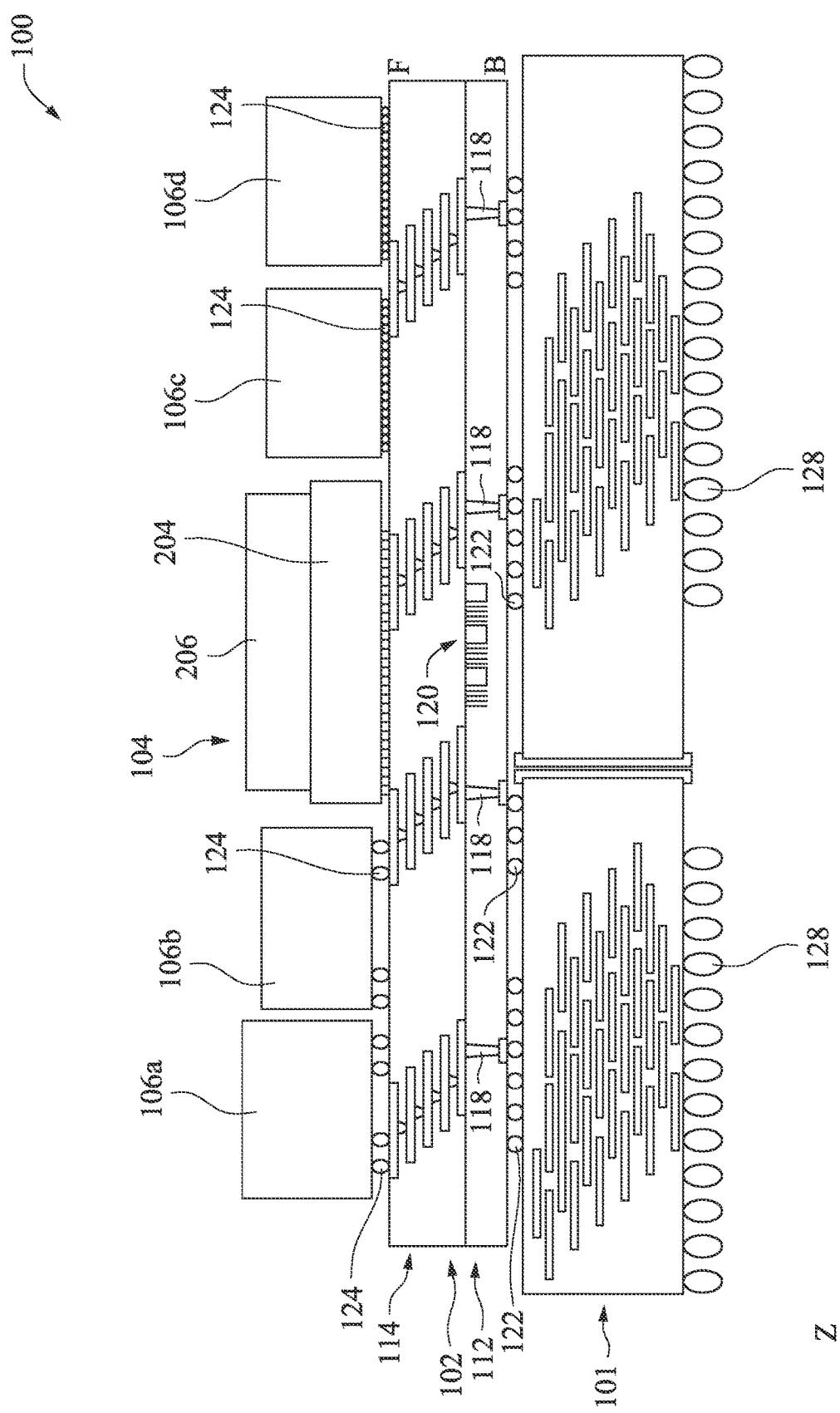
FIG. 1 is a schematic diagram illustrating an example semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Capacitors are used for a myriad of purposes on modern integrated circuits (IC). For example, decoupling capacitors are used to decouple one part of an electrical circuit, such as interconnect, from another part of the circuit. In such a configuration, noise arising from the interconnect can be shunted through a decoupling capacitor to reduce the effects of interconnect noise on the remainder of the circuit. Since such capacitors are often placed close to the circuit to eliminate parasitic inductances and resistances associated with the interconnect, there is a need to create a high-density capacitor in either the IC technology of interest or in a stand-alone process that results in an integrated capacitor device easily mountable on the IC.

The miniaturization of devices on modern integrated circuits resulted in challenges for circuit designers dealing with power delivery networks (PDNs, also known as power distribution networks). The last decade saw the rise of FinFET devices, bringing higher drive strengths compared to prior planar devices. The use of FinFET devices increases the drive strength per unit area, requiring higher current densities and larger current transients. This trend has resulted in chips that are increasingly sensitive to fluctuating supply voltages, exacerbating the power integrity challenges of system design. Circuit designers rely on decoupling capacitors as a fundamental tool for reducing the impedance of PDNs and suppressing noise by decoupling or bypassing one part of a circuit from another. For signals, noise from the interconnect can be shunted through a decoupling capacitor before being passed to another circuit. However, decoupling capacitors are generally physically located in close proximity to the desired circuit in order to reduce parasitic resistances and inductances.

On the other hand, packaging technologies are evolving rapidly, providing more platforms where advanced capacitor technologies can be employed. As will be described below, advanced capacitor technologies may be used in advanced packaging technologies such as Chip-on-Wafer-on-Substrate (CoWoS) and System on Integrated Chips (SoIC) technologies. These advanced packaging technologies enable the application of advanced capacitor technologies.

Packaging technologies were once considered just back-end processes, almost an inconvenience. Times have changed. Computing workloads have evolved more over the past decade than perhaps the previous four decades. Cloud computing, big data analytics, artificial intelligence (AI), neural network training, AI inferencing, mobile computing on advanced smartphones, and even self-driving cars are all pushing the computing envelope. Modern workloads have brought packaging technologies to the forefront of innovation, and they are critical to a product's performance, function, and cost. These modern workloads have pushed the product design to embrace a more holistic approach for optimization at the system level.

Chip-on-Wafer-on-Substrate (CoWoS) is a wafer-level multi-chip packaging technology. CoWoS is a packaging technology that incorporates multiple chips side-by-side on a silicon interposer in order to achieve better interconnect density and performance. Individual chips are bonded through, for example, micro-bumps on a silicon interposer, forming a chip-on-wafer (CoW) structure. The CoW structure is then subsequently thinner such that through-silicon-vias (TSVs) are exposed, which is followed by the formation of bumps (e.g., C4 bumps) and singulation. The CoW structure is then bonded to a package substrate forming the CoWoS structure. Since multiple chips or dies are generally incorporated in a side-by-side manner, the CoWoS is considered a 2.5-dimensional (2.5D) wafer-level packaging technology.

On the other hand, those multiple chips that are bonded to the interposer in a CoWoS structure can each include stacking dies or chiplets (i.e., modular dies), with multi-layers, multi-chip sizes, and multi-functions. In one implementation, the stacking dies are bonded together using hybrid bonding (HB). Hybrid bonding is a process that stacks and bonds dies using both dielectric bonding layers and metal-to-metal interconnects in advanced packaging. Since no bumps like micro-bumps are used, hybrid bonding is regarded as a bumpless bonding technique. Hybrid bonding can provide improved integration density, faster speeds, and higher bandwidth. In addition to die-to-die bonding, hybrid bonding can also be used for wafer-to-wafer bonding and die-to-wafer bonding. In another implementation, the stacking dies are bonded together using fusion bonding.

Stacking dies featuring ultra-high-density-vertical stacking (often using hybrid bonding) is sometimes referred to System on Integrated Chips (SoIC) technologies. SoIC technologies can achieve high performance, low power, and minimum resistance-inductance-capacitance (RLC). SoIC technologies integrate active and passive chips that are partitioned from System on Chip (SoC), into a new integrated SoC system, which is electrically identical to native SoC, to achieve better form factor and performance. A die stack bonded together using hybrid bonding is sometimes, therefore, referred to as a SoIC die stack ("SoIC die stack" and "die stack" are used interchangeably throughout the disclosure).

FIG. 1 is a schematic diagram illustrating an example semiconductor package in accordance with some embodiments. Shown there is a semiconductor package 100. In the example shown in FIG. 1, the semiconductor package 100 includes an interposer 102, a SoIC die stack 104, and multiple chips 106a, 106b, 106c, 106d, among other components. The SoIC die stack 104 and the multiple chips 106a-106d are located on and bonded to the top surface of the interposer 102 in the vertical direction (i.e., the Z-direction, as shown in FIG. 1). The SoIC die stack 104 and the multiple chips 106a-106d are located at various locations in the horizontal plane (i.e., the X-Y plane, as shown in FIG. 1) in a side-by-side manner. The interposer 102 is further bonded to a package substrate 101. In other words, the semiconductor package 100 is a CoWoS structure.

The interposer 102 provides an interface circuit between the package substrate 101, which may be bonded to a printed circuit board (PCB), and one or more of the SoIC die stack 104 and the multiple chips 106a-106d. In the example shown in FIG. 1, the interposer 102 includes a substrate section 112 and an interposer multilayer interconnect (MLI) structure 114. In one embodiment, the substrate section 112 is a silicon substrate. The substrate section 112 includes one or more through-silicon vias (TSVs) 118 through the substrate section 112. In the example shown in FIG. 1, a deep trench capacitor (DTC) structure 120 is disposed in the substrate section 112, and a portion of or the entire DTC structure 120 can be electrically connected to one or more of the SoIC die stack 104 and the multiple chips 106a-106d. Details of the DTC structure 120 will be described below with reference to FIGS. 2A to 9B. It should be understood that the semiconductor package 100 shown in FIG. 1 is one example of many applications of the DTC structure 120.

The interposer MLI structure 114 includes a combination of dielectric layers and conductive layers configured to form various interconnect structures. The conductive layers are configured to form vertical interconnect features (e.g., vias, etc.) and horizontal interconnect features (e.g., conductive lines extending in the X-Y plane). Vertical interconnect features typically connect horizontal interconnect features in different layers (e.g., a first metal layer often denoted as "M1" and a fifth metal layer often denoted as "M5") of the interposer MLI structure 114. The interposer MLI structure 114 is configured to route signals and/or distribute signals (e.g., clock signals, power signals, ground signals) to one or more of the SoIC die stack 104 and the chips 106a-106d. It should be understood that although the interposer MLI structure 114 is depicted in FIG. 1 with a given number of dielectric layers and conductive layers, the present disclosure contemplates interposer MLI structures having more or fewer dielectric layers and/or conductive layers depending on design requirements.

In addition, the interposer 102 shown in FIG. 1 also includes C4 copper bumps 122 and micro-bumps (i.e., µBumps) 124. At the back side (denoted as "B" in FIG. 1) of the interposer 102, the C4 copper bumps are used to bond the interposer 102 to the package substrate 101. It should be understood that C4 copper bumps are exemplary rather than limiting, and other types of bonding techniques may be employed in other implementations. Each of the TSVs 118 is electrically connected to at least one C4 copper bump 122.

At the front side (denoted as "F" in FIG. 1) of the interposer 102, the micro-bumps 124 are used to bond the chips 106a-106d to the interposer 102. It should be understood that micro-bumps are exemplary rather than limiting, and other types of bonding techniques may be employed in other implementations. As to the interface between the interposer 102 and the SoIC die stack 104, the SoIC die stack 104 can be bonded to the interposer 102 using hybrid bonding in one implementation. In other implementations, the SoIC die stack 104 can be bonded to the interposer 102 using other bonding techniques such as micro-bumps and fusion bonding.

As a result, the package substrate 101 can be electrically connected to one or more of the SoIC die stack 104 and the chips 106a-106d through the interposer 102. An exemplary electrical path includes the C4 copper bump 122, the TSV 118, the interposer MLI structure 114, and the micro-bump 124.

The chips 106a-106d are independent chips, which fulfill various functions. Each of the chips 106a-106d is one of, for example, a logic chip, a memory chip, a computation chip, a sensor chip, a radio frequency (RF) chip, a high voltage (HV) chip, and the like.

In the example shown in FIG. 1, the SoIC die stack 104 includes a bottom die 204 and a top die 206. A bonding layer is formed on the top surface of the bottom die 204, and another bonding layer is formed on the bottom surface of the top die 206. Those bonding layers are made of a dielectric (e.g., silicon dioxide) and used for bonding the top die 206 to the bottom die 204. Pairs of hybrid bonding metal pads are formed in those bonding layers. When the top die 206 and the bottom die 204 are bonded together, each pair of hybrid bonding metal pads are aligned in the X-Y plane and in contact with each other, providing an electrical path between the bottom die 204 and the top die 206. As the hybrid bonding metal pads can have small critical dimensions and pitches, the SoIC die stack 104 can achieve better interconnect density and performance (e.g., faster speeds, higher bandwidth, and the like).

For die-to-die boding, back-end processes, such as dicing, die handling, and die transport on film frame, have to be adapted to front-end clean levels, allowing high bonding yields on a die level. For example, copper hybrid bonding is conducted in a cleanroom in a wafer fab, instead of in an outsourced semiconductor assembly and test (OSAT) facility. Pick-and-place systems are often used to handle dies in the context of die-to-die boding or die-to-wafer boding. A pick-and-place system is an automatic system that can pick a top die and place it onto the bottom die or a host wafer, often in a high-speed manner.

FIGS. 2A to 8C illustrate a method for manufacturing a deep-trench-capacitor (DTC) structure at various stages in accordance with some embodiments of the present disclosure. In some embodiments, the method of FIGS. 2A to 8C illustrate a method for manufacturing the DTC structure 120 as described in FIG. 1.

Figure 2A:
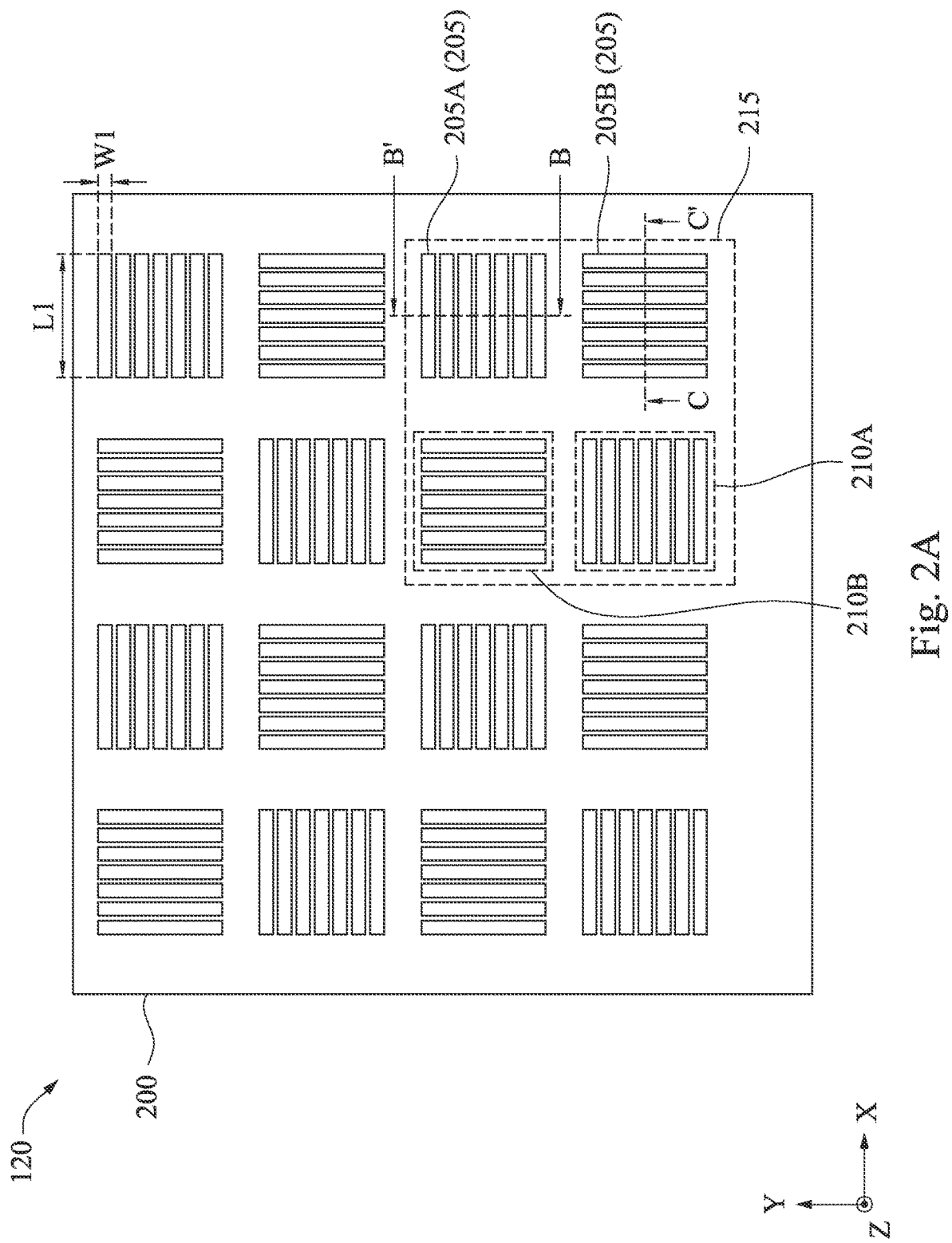
FIGS. 2A to 8C illustrate a method for manufacturing a deep-trench-capacitor (DTC) structure at various stages in accordance with some embodiments of the present disclosure.
Figure 2B:
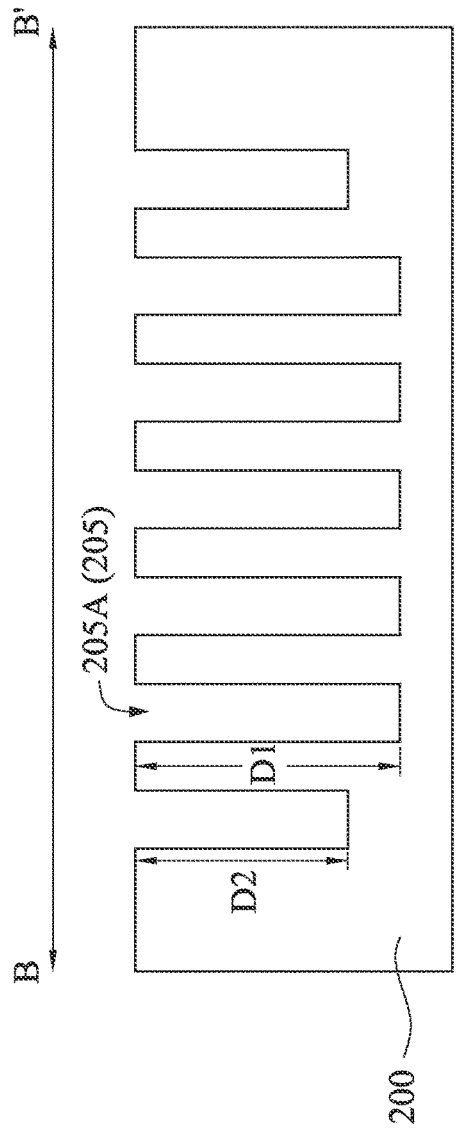
Figure 2C:
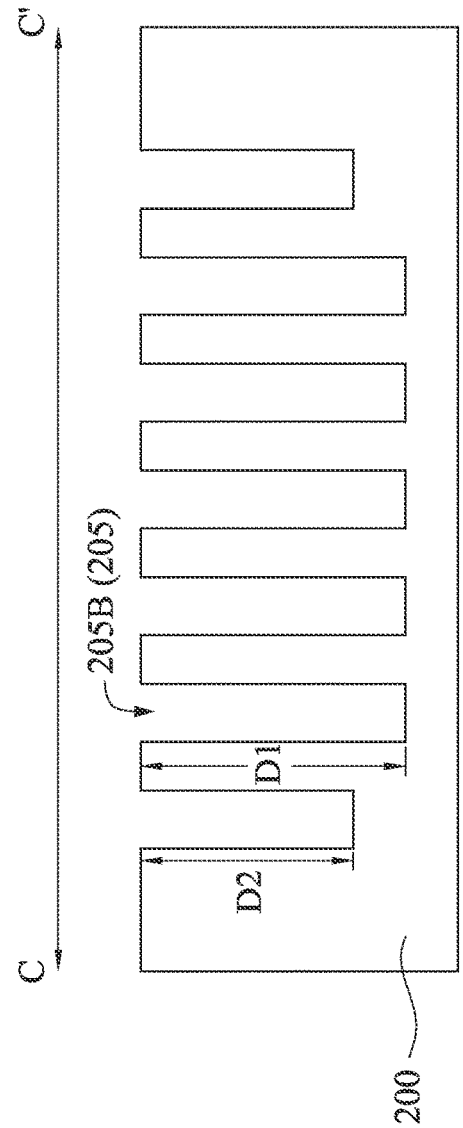

Reference is made to FIGS. 2A to 2C, in which FIG. 2A is a top view of a DTC structure, FIG. 2B is a cross-sectional view along line B-B of FIG. 2A, and FIG. 2C is a cross-sectional view along line C-C of FIG. 2A. Shown there is a substrate 200, in which the DTC structure may be formed in the substrate 200. In some embodiments, the substrate 200 may be a semiconductor substrate including a semiconductor material, and may have a thickness of at least 10 microns. In one embodiment, the substrate 200 may include a semiconductor wafer that may be diced into semiconductor dies after formation of deep trenches. For example, the substrate 200 may include a semiconductor substrate including single crystalline silicon and having a thickness in a range from 500 microns to 1,500 microns, although thicker or thinner substrates may be used.

Deep trenches 205 are formed vertically extending into the substrate 200. In some embodiments, the deep trenches 205 may be formed by forming a patterned mask layer on the front side surface of the substrate 200. The patterned mask layer may include a plurality of openings, which correspond to the pattern of the patterned mask layer. An etching process is performed to remove portions of the substrate 200 exposed by the openings of the patterned mask layer, such that pattern in the patterned mask layer may be transferred into an upper portion of the substrate 200. In other embodiments, an optional pad dielectric layer (not shown) such as a silicon oxide pad layer may be formed on the front side surface, i.e., the top surface, of the substrate 200 prior to formation of the patterned mask layer. In such embodiments, the pad dielectric layer may include a silicon oxide layer having a thickness in a range from 20 nm to 100 nm, although thicker or thinner pad dielectric layers may be used.

In some embodiments, the patterned mask layer may include a silicon nitride layer or a borosilicate glass (BSG) layer. The patterned mask layer may be formed by depositing a blanket mask layer, forming a lithographically patterned photoresist layer over the blanket etch mask layer, and by transferring the pattern in the lithographically patterned photoresist layer through the blanket etch mask layer using an anisotropic etch process such as a reactive ion etch process. The anisotropic etch process may be performed to transfer the pattern in the patterned mask layer through an upper portion of the substrate 200 to form the deep trenches 205. For example, a reactive ion etch process using a combination of gases including HBr, $NF_3$, $O_2$, and $SF_6$ may be used to form the deep trenches 205.

In some embodiment, each of the deep trenches 205 may be laterally elongated with a substantially uniform width. Each of deep trenches 205 may have a width that is sufficient to accommodate vertically-extending portions of all metallic electrode layers and dielectric layers to be subsequently formed. As shown in FIG. 2A, each of the deep trenches 205 may include a width W1 and a length L1. In some embodiments, the width W1 is in a range from about 10 nm to about 2000 nm, the length L1 is in a range from about 1 μm to about 10 μm. In some embodiments, the length-to-width ratio of each deep trench 205 may be in a range from about 100 to 1000. In some embodiments, the depth-to-width ratio of each deep trench 205 may be in a range from 10 to about 200.

The deep trenches 205 may include first-type deep trenches 205A and second-type deep trenches 205B. As shown in FIG. 2A, the first-type deep trenches 205A each includes a lengthwise direction extending along a first direction (e.g., X-direction), and the second-type deep trenches 205B each includes a lengthwise direction extending along a second direction (e.g., Y-direction) that is perpendicular to the first direction. That is, the lengthwise direction of each first-type deep trenches 205A is perpendicular to the lengthwise direction of each second-type deep trenches 205B.

In the top view of FIG. 2A, the DTC structure may include a plurality of deep trench groups 210A and a plurality of deep trench groups 210B. In greater details, each of the deep trench groups 210A may include a plurality of first-type deep trenches 205A, and each of the deep trench groups 210B may include a plurality of second-type deep trenches 205B. In the illustrated example of FIG. 2A, each deep trench group 210A includes 7 first-type deep trenches 205A, and each deep trench group 210B includes 7 second-type deep trenches 205B, while more or less number of the first-type deep trenches 205A and/or the second-type deep trenches 205B may also be applied.

The deep trench groups 210A and the deep trench groups 210B are alternately arranged in multiple rows and multiple columns extending in the X-Y plane as shown in FIG. 2A. In greater details, the deep trench groups 210A and the deep trench groups 210B laterally alternate along the X-direction in FIG. 2A. Similarly, the deep trench groups 210A and the deep trench groups 210B laterally alternate along the Y-direction in FIG. 2A.

In some embodiments, parts of the deep trench groups 210A and the deep trench groups 210B may form a DTC unit cell 215. In the example of FIG. 2A, each of the DTC unit cells 215 includes two deep trench groups 210A and two deep trench groups 210B arranged in a 2×2 matrix. In greater details, a DTC unit cell 215 is a building block, each corresponding to a unit capacitance. All of the DTC unit cells 215 in the DTC structure 120 are available to be combined to provide a target capacitance based on circuit design requirements. In other words, the DTC structure 120 offers a bank of DTC unit cells 215 that can be utilized flexibly.

In FIG. 2B, with respect to the deep trench group 210A, the outermost two of the first-type deep trenches 205A have a depth D2, while other first-type deep trenches 205A have a depth D1. In some embodiments, the depth D2 is smaller than the depth D1. That is, the outermost two of the first-type deep trenches 205A are shallower than other first-type deep trenches 205A. In some embodiments, the outmost first-type deep trenches 205A can also be referred to as edge trenches. In some embodiments, D2 is smaller than D1 by 1%. In other embodiments, D2 is smaller than D1 by 2%. In yet other embodiments, D2 is smaller than D1 by 3%. In yet other embodiments, D2 is smaller than D1 by 5%.

In FIG. 2C, with respect to the deep trench group 210B, the outermost two of the second-type deep trenches 205B have a depth D2, while other second-type deep trenches 205B have a depth D1. In some embodiments, the depth D2 is smaller than the depth D1. That is, the outermost two of the second-type deep trenches 205B are shallower than other second-type deep trenches 205B. In some embodiments, the outmost second-type deep trenches 205B can also be referred to as edge trenches. In some embodiments, D2 is smaller than D1 by 1%. In other embodiments, D2 is smaller than D1 by 2%. In yet other embodiments, D2 is smaller than D1 by 3%. In yet other embodiments, D2 is smaller than D1 by 5%.

Figure 3A:
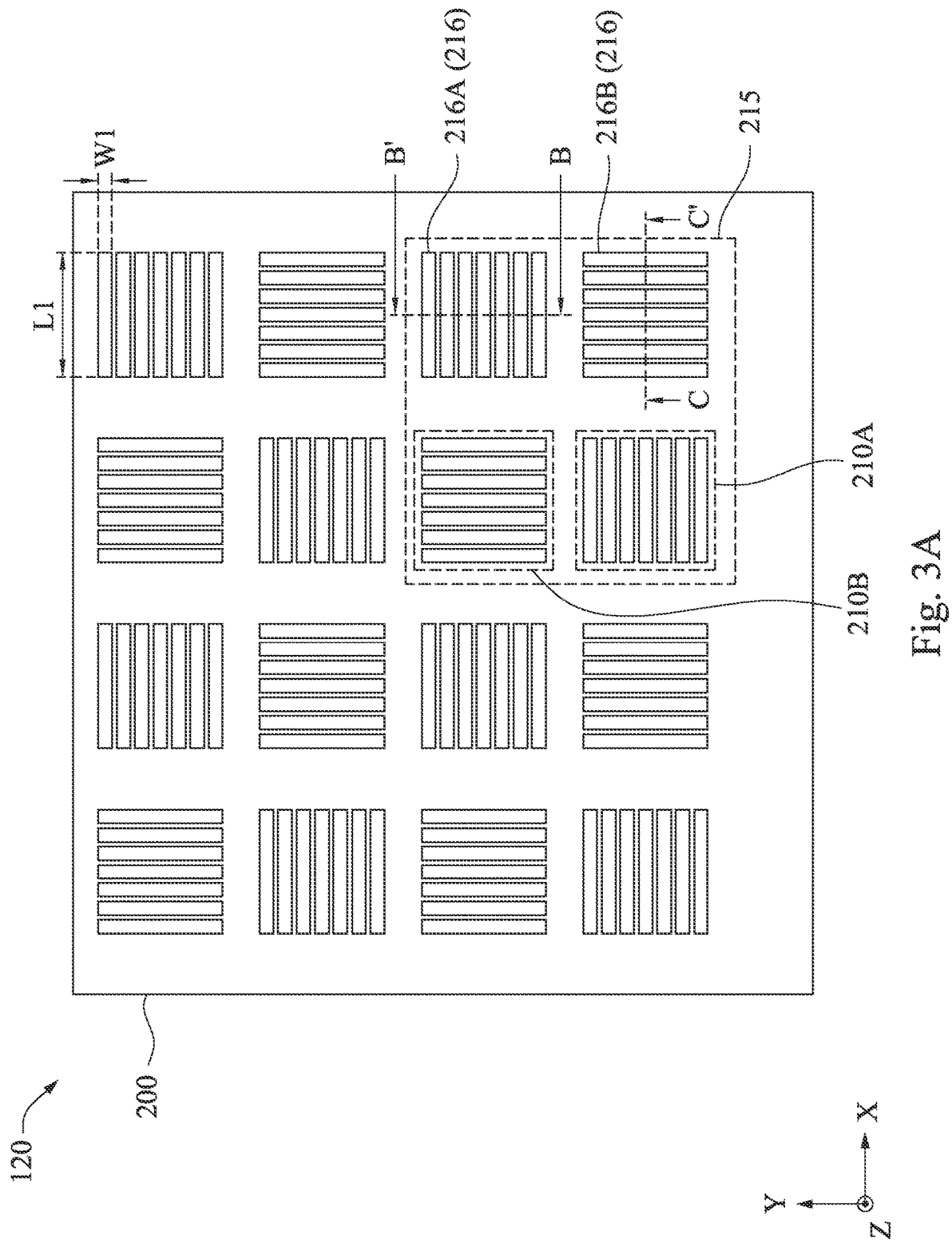
Figure 3B:
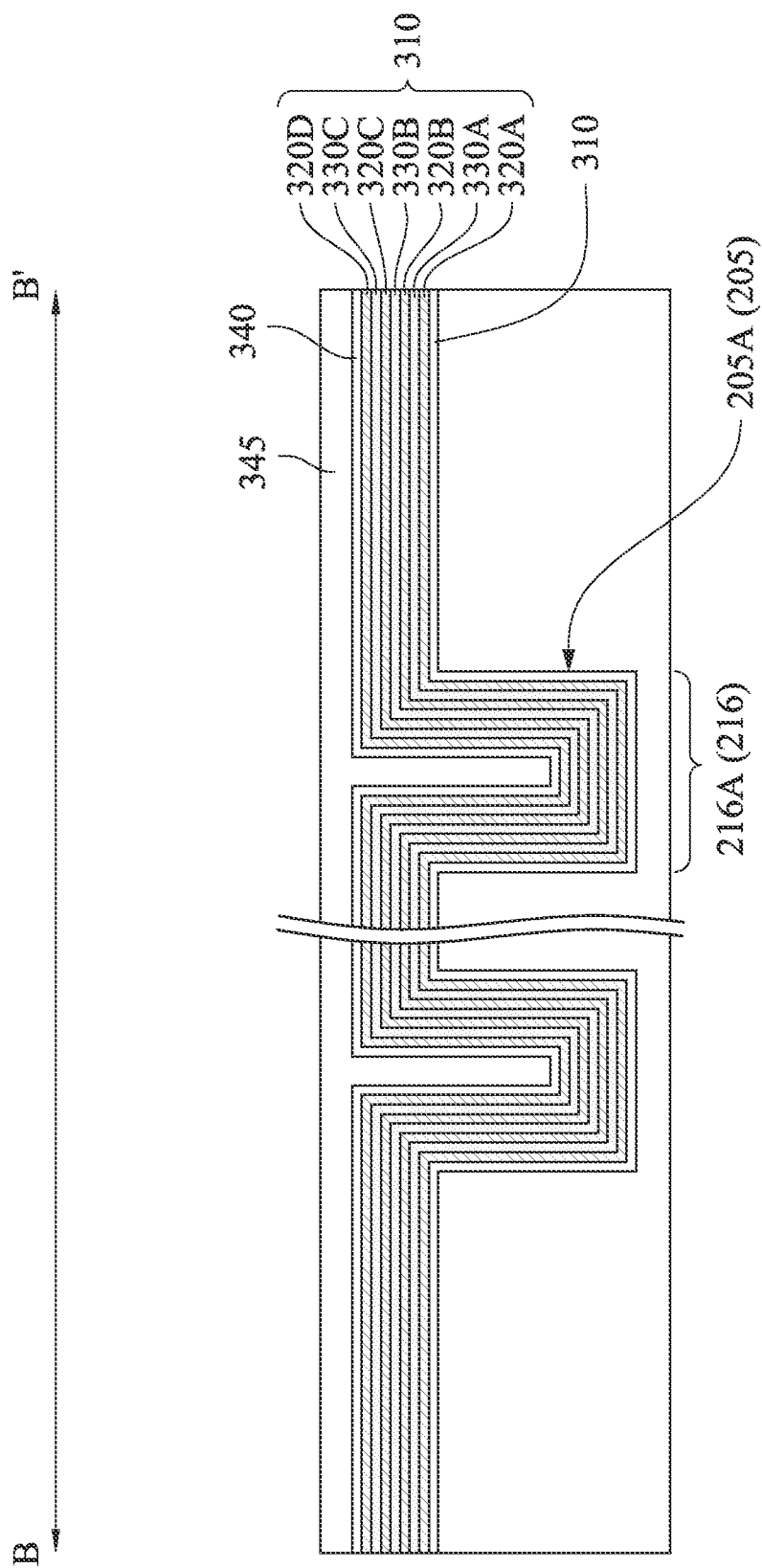
Figure 3C:
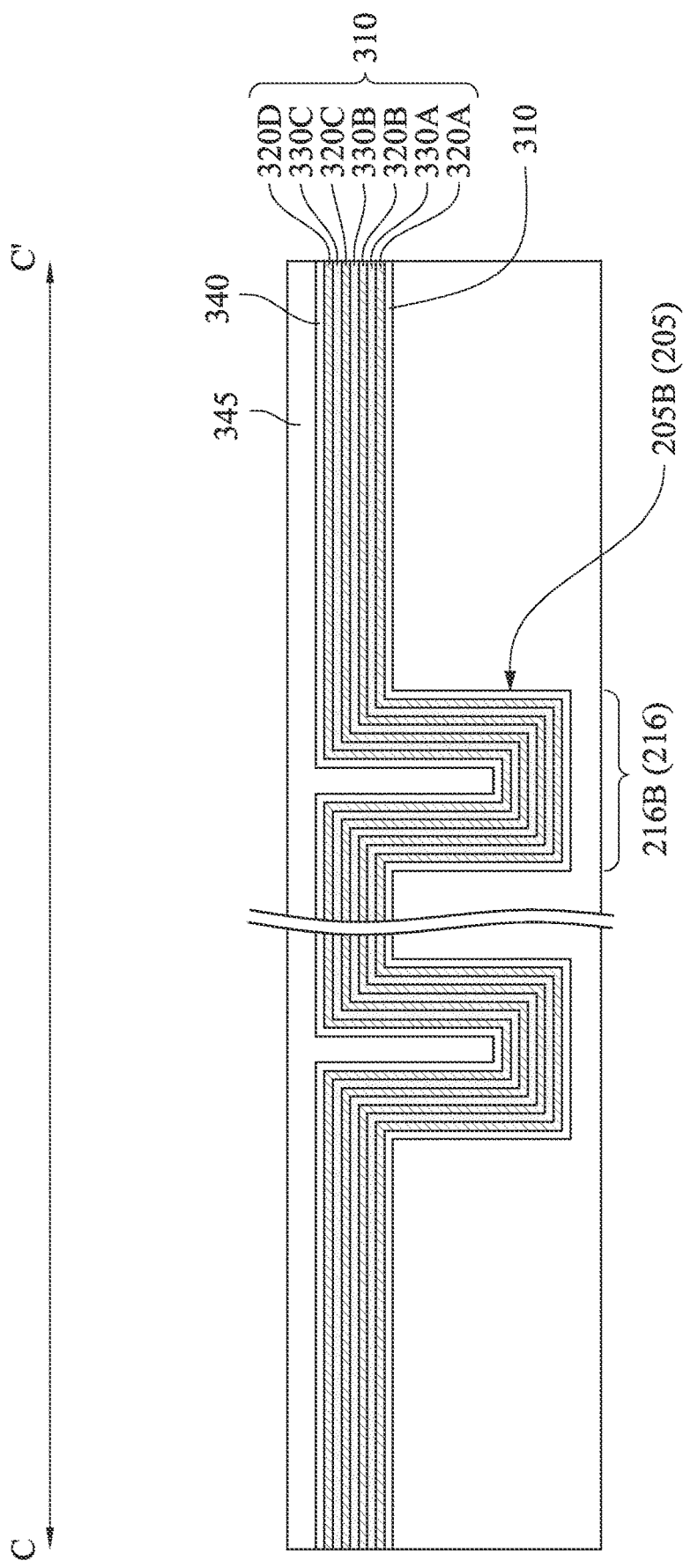

Reference is made to FIGS. 3A to 3C, in which FIG. 3A is a top view of a DTC structure, FIG. 3B is a cross-sectional view along line B-B of FIG. 3A, and FIG. 3C is a cross-sectional view along line C-C of FIG. 3A. It is noted that in FIGS. 3B and 3C, some of the first-type deep trenches 205A and the second-type deep trenches 205B are omitted to clearly illustrate the structure of the materials filled in the first-type deep trenches 205A and/or the second-type deep trenches 205B. In FIG. 3B, the illustrated first-type deep trenches 205A can be the outmost first-type deep trenches 205A of FIG. 2B, and can also be other first-type deep trenches 205A of FIG. 2B. Similarly, in FIG. 3C, the illustrated second-type deep trenches 205B can be the outmost first-type deep trenches 205A of FIG. 2C, and can also be other second-type deep trenches 205B of FIG. 2C.

A dielectric liner 300 may be formed on the physically exposed surface of the semiconductor substrate 200 including the top surface of the semiconductor substrate 200 and sidewalls of each of the deep trenches 205. In some embodiments, the dielectric liner 300 may include a dielectric material that provides electrical isolation between the deep trench capacitors to be subsequently formed in the substrate 200. For example, the dielectric liner 300 may include silicon oxide, silicon nitride, silicon oxynitride, a dielectric metal oxide, other suitable materials within the contemplated scope of disclosure may also be used. In the illustrative examples, the dielectric liner 300 may include a silicon oxide layer formed by thermal oxidation of surface portions of the substrate 200 that includes silicon. The thickness of the dielectric liner 300 may be in a range from 4 nm to 100 nm, although lesser and greater thicknesses may also be used.

An alternating layer stack 310 of metallic electrode layers 320A, 320B, 320C, 320D and node dielectric layers 330A, 330B, 330C may be formed by a respective conformal deposition process. The alternating layer stack 310 includes at least three metallic electrode layers 320A, 320B, 320C, 320D interlaced with the node dielectric layers 330A, 330B, 330C, respectively, and continuously extending over the top surface of the semiconductor substrate 200 and into each of the deep trenches 205. The alternating layer stack 310 may continuously extends into each deep trench 205. A cavity may be present in an unfilled volume each the deep trench 205. Generally, the metallic electrode layers 320A, 320B, 320C, 320D and the node dielectric layers 330A, 330B, 330C are deposited by a respective conformal deposition process.

Each of the metallic electrode layers 320A, 320B, 320C, 320D may include a metallic material, which may comprise, and/or consist essentially of, a conductive metallic nitride, an elemental metal, or an intermetallic alloy. In some embodiment, each metallic electrode layer 320A, 320B, 320C, 320D comprises, and/or consists essentially of, a conductive metallic nitride material, which may be a metallic diffusion barrier material. For example, each metallic electrode layer 320A, 320B, 320C, 320D may include, and/or may consist essentially of, a conductive metallic nitride material such as TiN, TaN, or WN. Other suitable materials within the contemplated scope of disclosure may also be used.

Use of a metallic diffusion barrier material for the metallic electrode layers 320A, 320B, 320C, 320D may be advantageous because diffusion of metallic elements through the node dielectric layers 330A, 330B, 330C and/or through the dielectric liner 300 may cause deleterious effects for deep trench capacitors. Each metallic electrode layer 320A, 320B, 320C, 320D may be formed by a conformal deposition process such as chemical vapor deposition (CVD) or atomic layer deposition (ALD). The thickness of each metallic electrode layer 320A, 320B, 320C, 320D may be in a range from 5 nm to 50 nm, such as from 10 nm to 30 nm, although lesser and greater thicknesses may also be used. In some embodiments, the metallic electrode layers 320A, 320B, 320C, 320D may have the same material composition and the same thickness. In other embodiments, the metallic electrode layer 320A, 320B, 320C, 320D may have the same material composition but have varying thicknesses. In yet other embodiments, the metallic electrode layer 320A, 320B, 320C, 320D may have different material compositions and the same thickness. In yet other embodiments, the metallic electrode layer 320A, 320B, 320C, 320D may have different material compositions and different thicknesses.

Each of node dielectric layers 330A, 330B, 330C may include a node dielectric material, which may be a dielectric metal oxide material having a dielectric constant greater than 7.9 (which is the dielectric constant of silicon nitride), i.e., a "high-k" dielectric metal oxide material, or may include silicon nitride. For example, the node dielectric layers 330A, 330B, 330C may include a dielectric metal oxide material such as aluminum oxide, hafnium oxide, zirconium oxide, tantalum oxide, lanthanum oxide, an alloy or a silicate thereof, and/or a layer stack thereof. In some embodiments, the node dielectric layers 330A, 330B, 330C may include amorphous aluminum oxide layer that may be subsequently annealed into polycrystalline aluminum oxide material after formation of contact via structures. Other suitable materials within the contemplated scope of disclosure may also be used.

Each of the node dielectric layers 330A, 330B, 330C may be formed by a conformal deposition process such as chemical vapor deposition (CVD) or atomic layer deposition (ALD). The thickness of the node dielectric layers 330A, 330B, 330C may be in a range from 1 nm to 20 nm, such as from 3 nm to 12 nm, although lesser and greater thicknesses may also be used. In some embodiments, the node dielectric layers 330A, 330B, 330C may have the same material composition and the same thickness. In other embodiments, the node dielectric layers 330A, 330B, 330C may have the same material composition but have varying thicknesses. In yet other embodiments, the node dielectric layer 330A, 330B, 330C may have different material compositions and the same thickness. In yet other embodiments, the node dielectric layers 330A, 330B, 330C may have different material composition and different thicknesses.

While the present disclosure is described using an embodiment in which the alternating layer stack 310 of the metallic electrode layers 320A, 320B, 320C, 320D and the node dielectric layers 330A, 330B, 330C include four metallic electrode layers and three node dielectric layers, embodiments are expressly contemplated herein in which different numbers of metallic electrode layers and different numbers of node dielectric layers may be used within the alternating layer stack 30. Generally, an alternating layer stack 310 may include at least three metallic electrode layers interlaced with at least two node dielectric layers that may be formed in, and over, at least one deep trench 205 formed in a substrate 200. In some other embodiments, the total number of the metallic electrode layers may be in a range from 3 to 16, such as from 4 to 8. The total number of the node dielectric layers may be one less than the total number of the metallic electrode layers.

A capping dielectric material layer 340 and a dielectric fill material layer 345 may be optionally deposited over the alternating layer stack 30. The capping dielectric material layer 340 may include a same dielectric material as the node dielectric layers 330A, 330B, 330C, and may have a thickness in a range from 1 nm to 20 nm, such as from 3 nm to 12 nm, although lesser and greater thicknesses may also be used.

The dielectric fill material layer 345 may be deposited on the capping dielectric material layer 340 or on the alternating layer stack 310 to fill the volumes of cavities that remain in the deep trenches 205. In one embodiment, the dielectric fill material layer 345 comprises, and/or consists essentially of, undoped silicate glass or a doped silicate glass.

After the dielectric fill material layer 345 is formed, the capacitor structure 120 is formed. In some embodiments, the capacitor structure 120 may include the dielectric liner 300, the alternating layer stack 310, the capping dielectric material layer 340, and the dielectric fill material layer 345. In some embodiments, each portion of the capacitor structure 120 filled in the deep trenches 205 can be referred to as a capacitor unit 216. In some embodiments, each capacitor unit 216 may include the same width (e.g., width W1), the same length (e.g., length L1), and the same depth (e.g., the depth D1 or D2) as the corresponding one of the deep trenches 205. In some embodiments, the capacitor units 216 may include capacitor units 216A filled in the first-type deep trenches 205A and capacitor units 216B filled in second-type deep trenches 205B. Accordingly, the capacitor units 216A each includes a lengthwise direction extending along a first direction (e.g., X-direction), and the capacitor units 216B each includes a lengthwise direction extending along a second direction (e.g., Y-direction) that is perpendicular to the first direction.

Similarly, the capacitor units 216A may form the deep trench groups 210A and the capacitor units 216B may form the deep trench groups 210B. The deep trench groups 210A and the deep trench groups 210B may form a DTC unit cell 215. Details have been described with respect to FIGS. 2A to 2C, and will not be repeated for brevity.

Figure 4A:
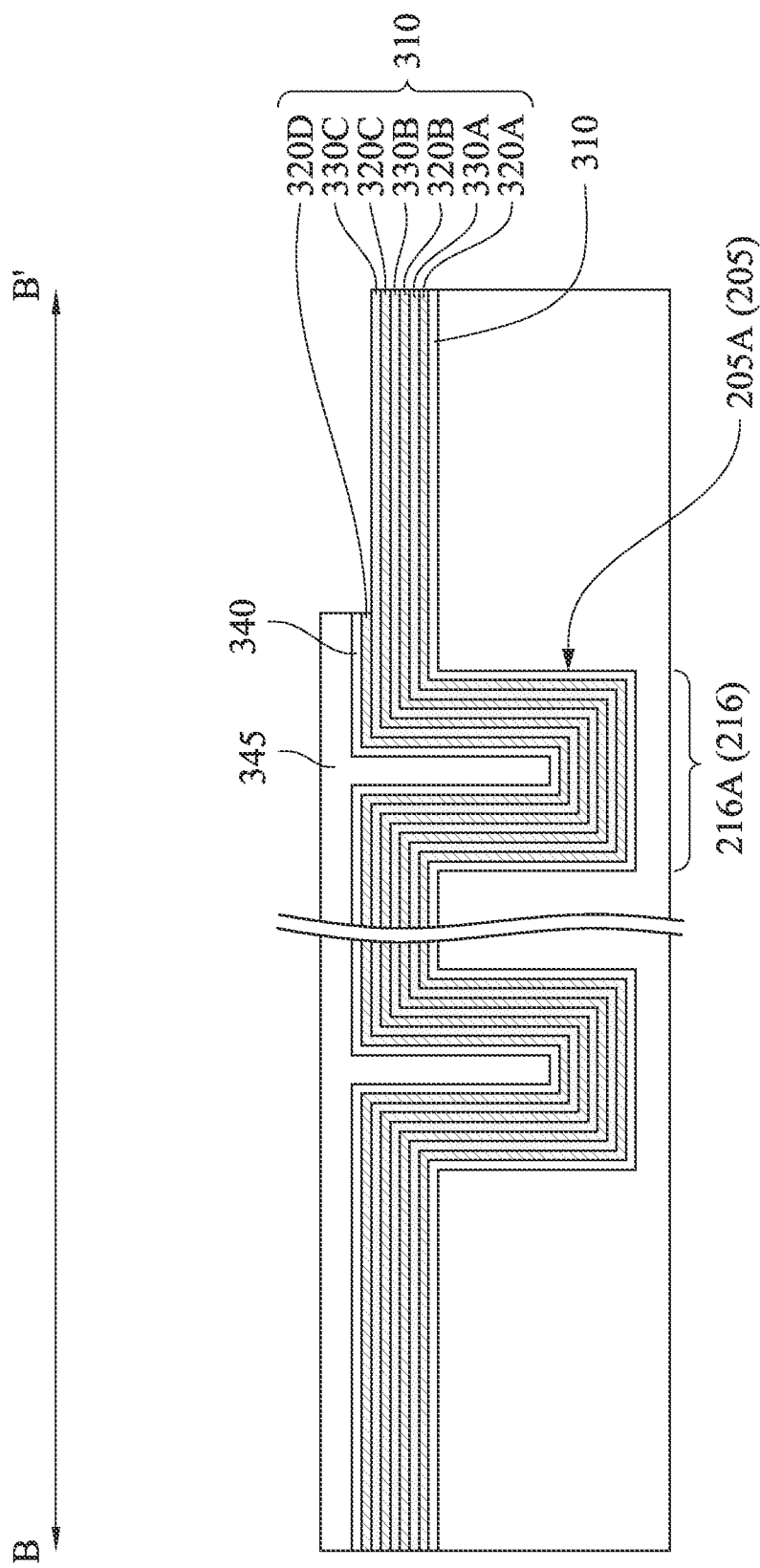
Figure 4B:
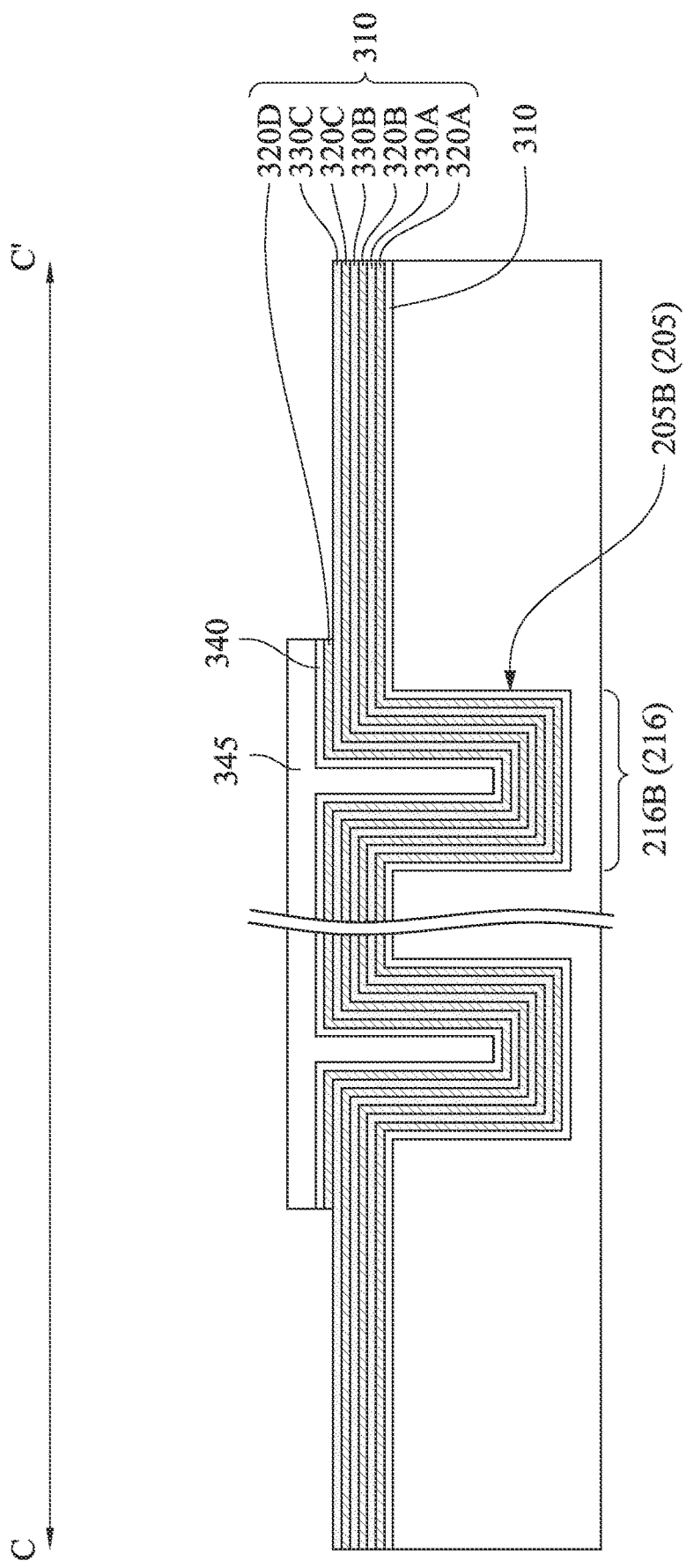

Reference is made to FIGS. 4A and 4B, in which FIG. 4A follows the cross-sectional view of FIG. 3B, and FIG. 4B follows the cross-sectional view of FIG. 3C. A first patterning process is performed. In some embodiments, the first patterning process is performed to remove portions of the dielectric fill material layer 345, the capping dielectric material layer 340, and the metallic electrode layer 320D. Accordingly, portions of the node dielectric layer 330C may be exposed. In some embodiments, the first patterning process may be performed by, for example, forming a patterned mask having openings exposes unwanted portions of the dielectric fill material layer 345, the capping dielectric material layer 340, and the metallic electrode layer 320D, performing an etching process to remove the exposed portions of the dielectric fill material layer 345, the capping dielectric material layer 340, and the metallic electrode layer 320D, and then removing the patterned mask after the etching process is completed. In some embodiments, the etching process may stop at the node dielectric layer 330C. That is, the node dielectric layer 330C ay act as an etch stop layer for the etching process of the first patterning process.

Figure 5A:
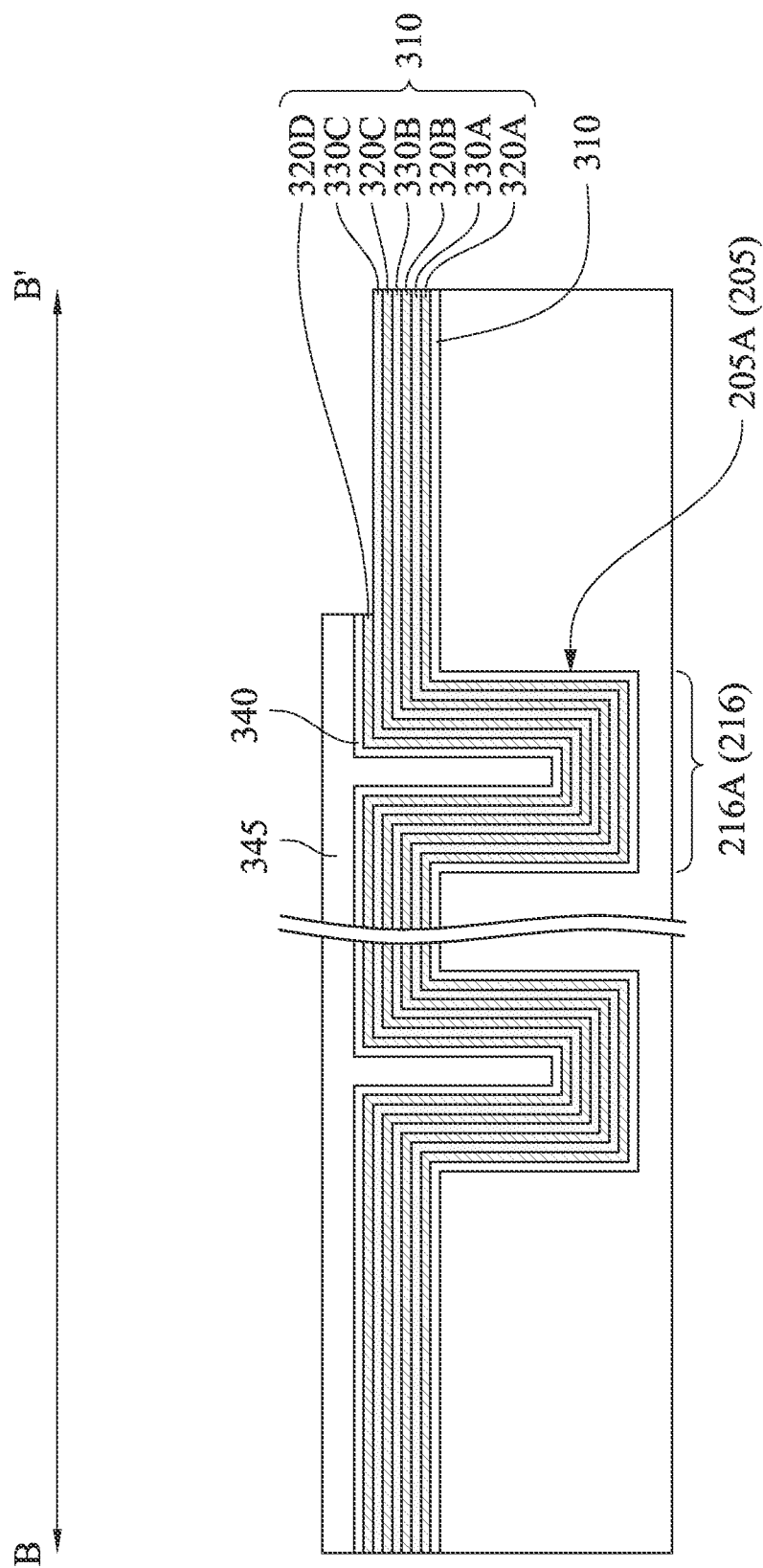
Figure 5B:
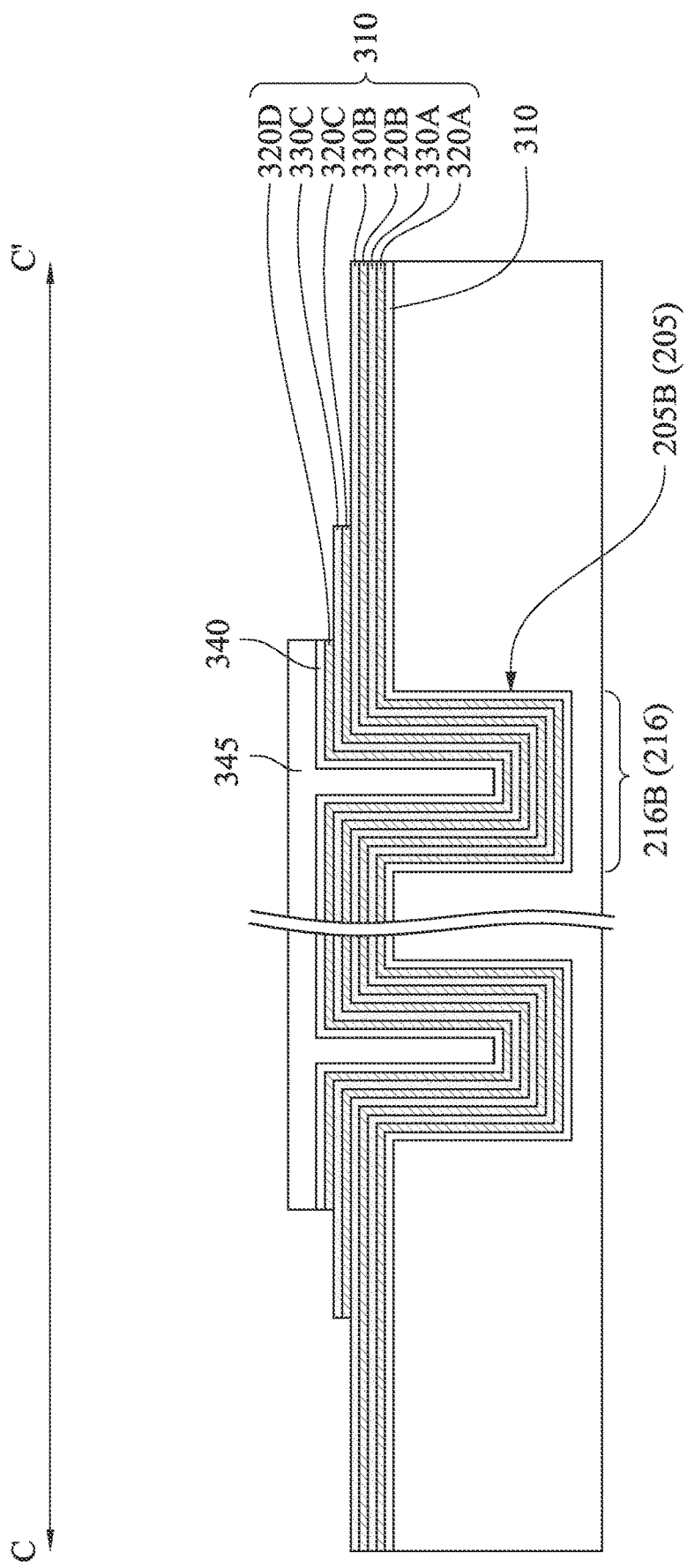

Reference is made to FIGS. 5A and 5B, in which FIG. 5A follows the cross-sectional view of FIG. 4A, and FIG. 5B follows the cross-sectional view of FIG. 4B. A second patterning process is performed. In some embodiments, the second patterning process is performed to remove portions of the node dielectric layer 330C and the metallic electrode layer 320C. Accordingly, portions of the node dielectric layer 330B may be exposed. In some embodiments, the second patterning process may be performed by, for example, forming a patterned mask having openings exposes unwanted portions of the node dielectric layer 330C and the metallic electrode layer 320C, performing an etching process to remove the exposed portions of the node dielectric layer 330C and the metallic electrode layer 320C, and then removing the patterned mask after the etching process is completed. In some embodiments, the etching process may stop at the node dielectric layer 330B. That is, the node dielectric layer 330B ay act as an etch stop layer for the etching process of the second patterning process.

Figure 6A:
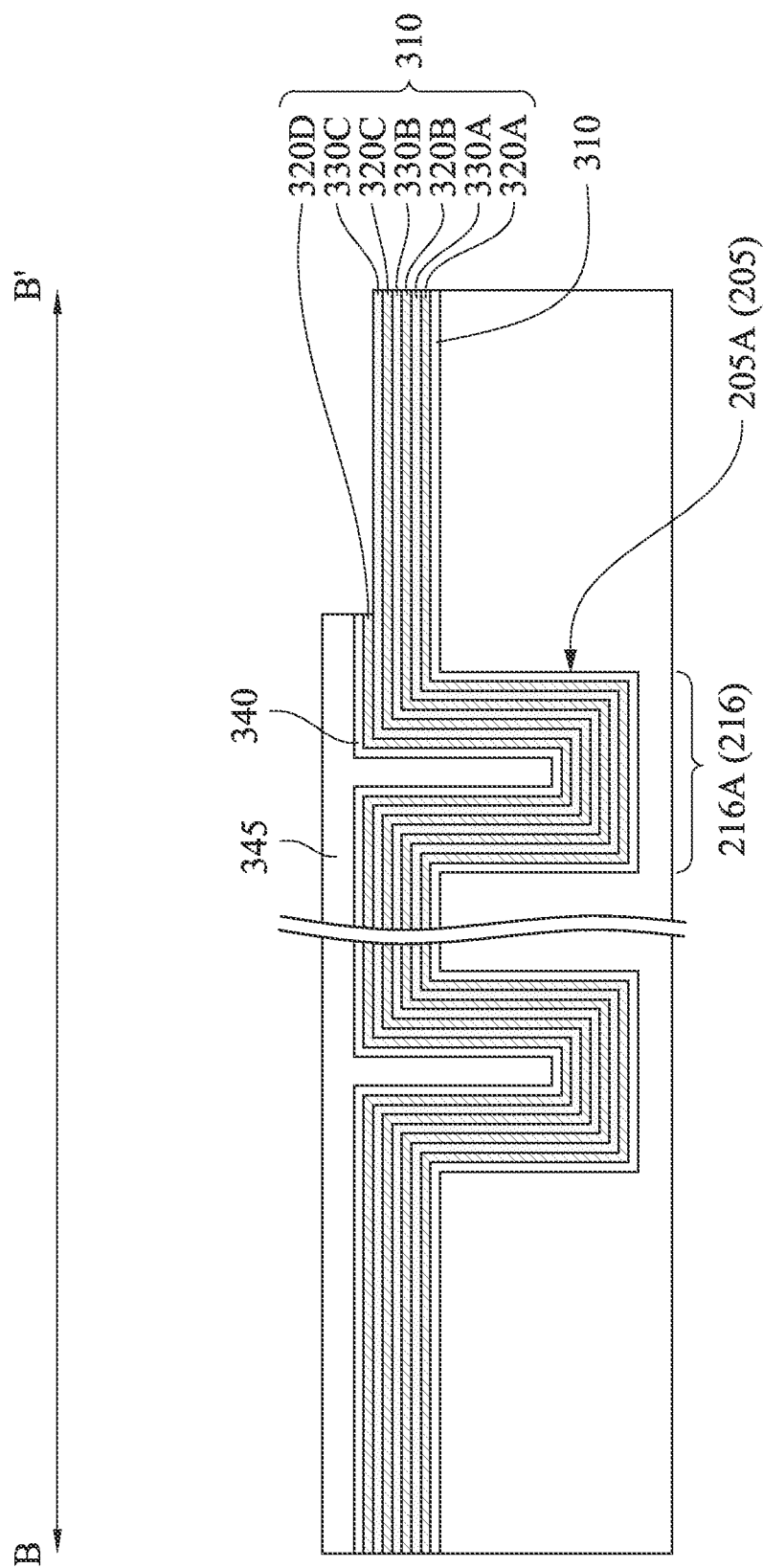
Figure 6B:
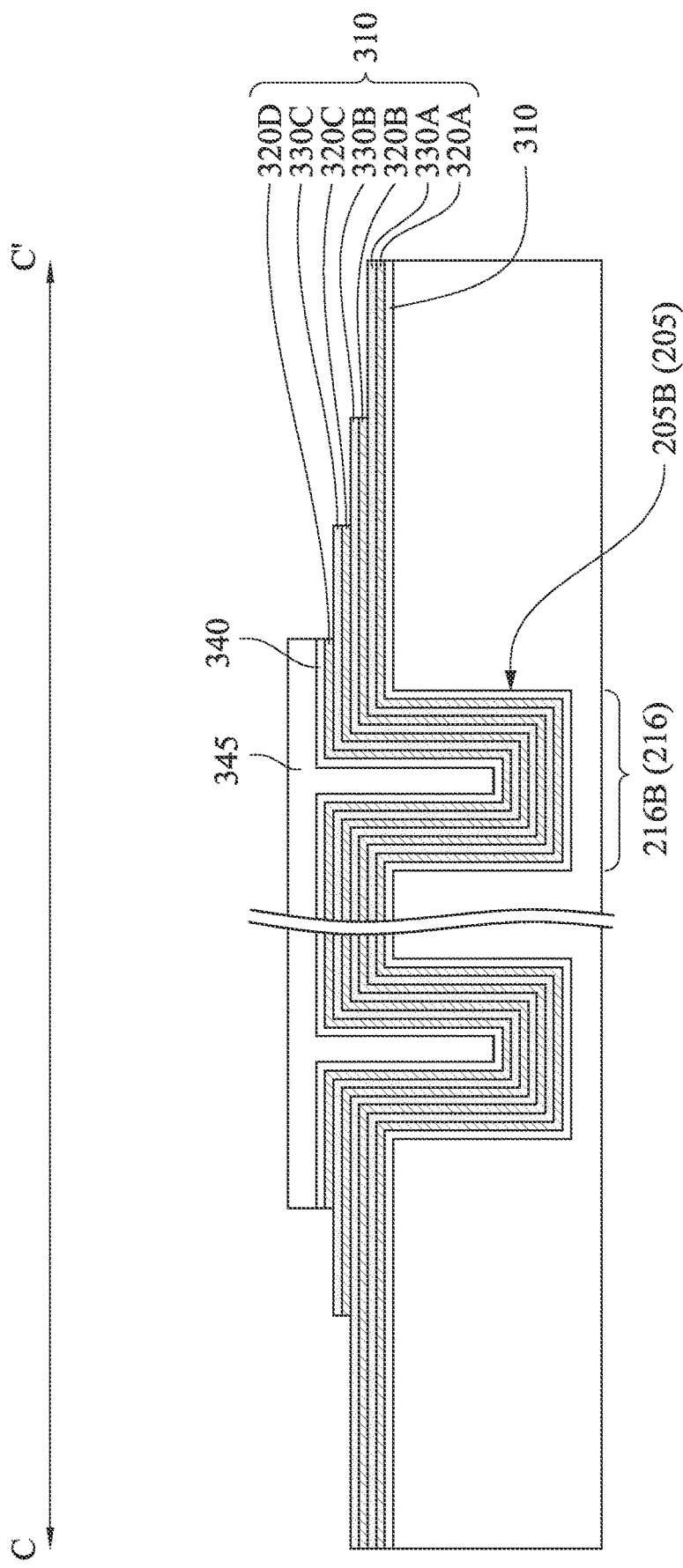

Reference is made to FIGS. 6A and 6B, in which FIG. 6A follows the cross-sectional view of FIG. A, and FIG. 6B follows the cross-sectional view of FIG. 5B. A third patterning process is performed. In some embodiments, the third patterning process is performed to remove portions of the node dielectric layer 330B and the metallic electrode layer 320B. Accordingly, portions of the node dielectric layer 330A may be exposed. In some embodiments, the third patterning process may be performed by, for example, forming a patterned mask having openings exposes unwanted portions of the node dielectric layer 330B and the metallic electrode layer 320B, performing an etching process to remove the exposed portions of the node dielectric layer 330B and the metallic electrode layer 320B, and then removing the patterned mask after the etching process is completed. In some embodiments, the etching process may stop at the node dielectric layer 330A. That is, the node dielectric layer 330A ay act as an etch stop layer for the etching process of the second patterning process.

After the patterning processes described in FIGS. 4A to 6B are completed, the DTC structure 120 may include staircase structures over the top surface of the substrate 200.

Figure 7A:
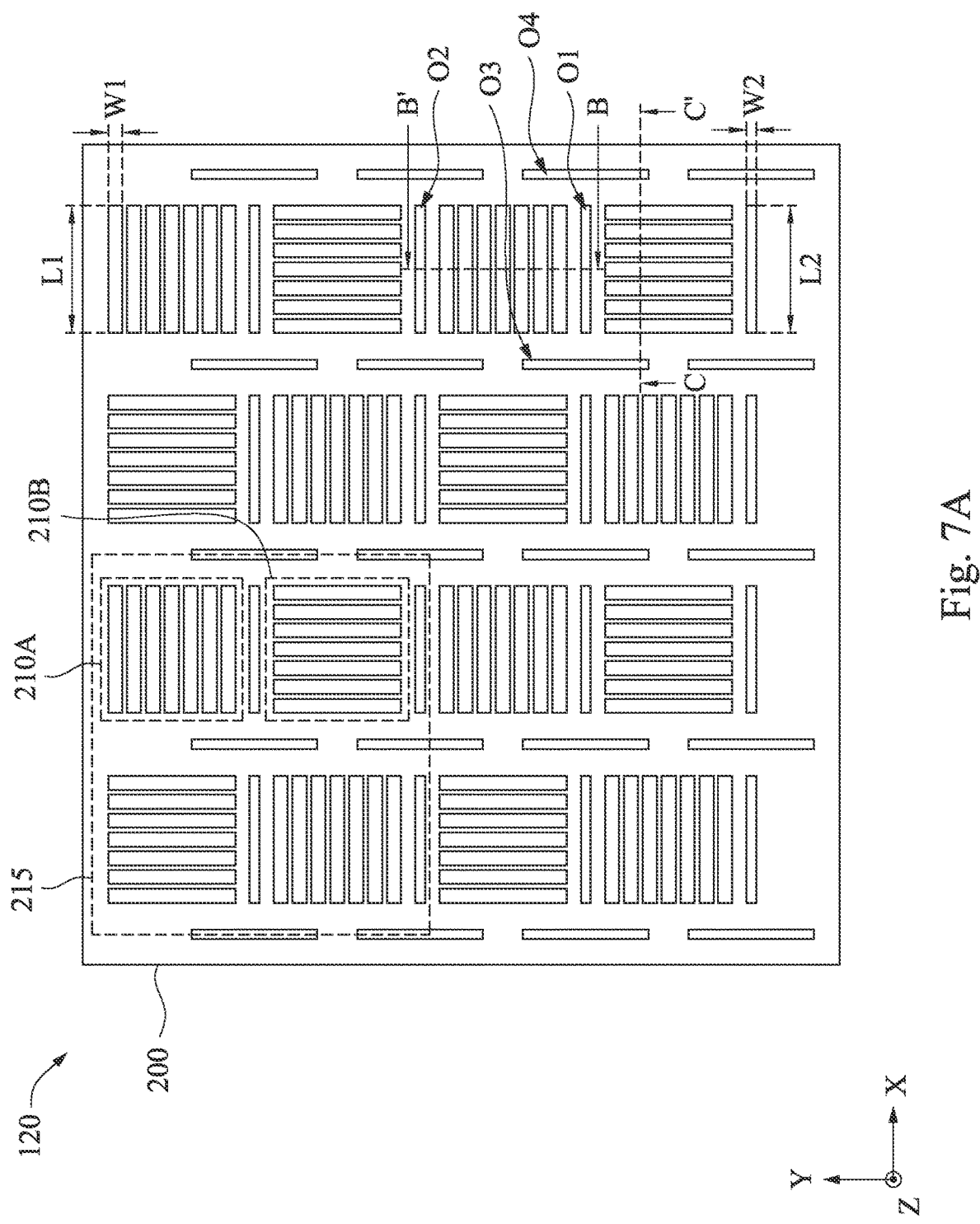
Figure 7B:
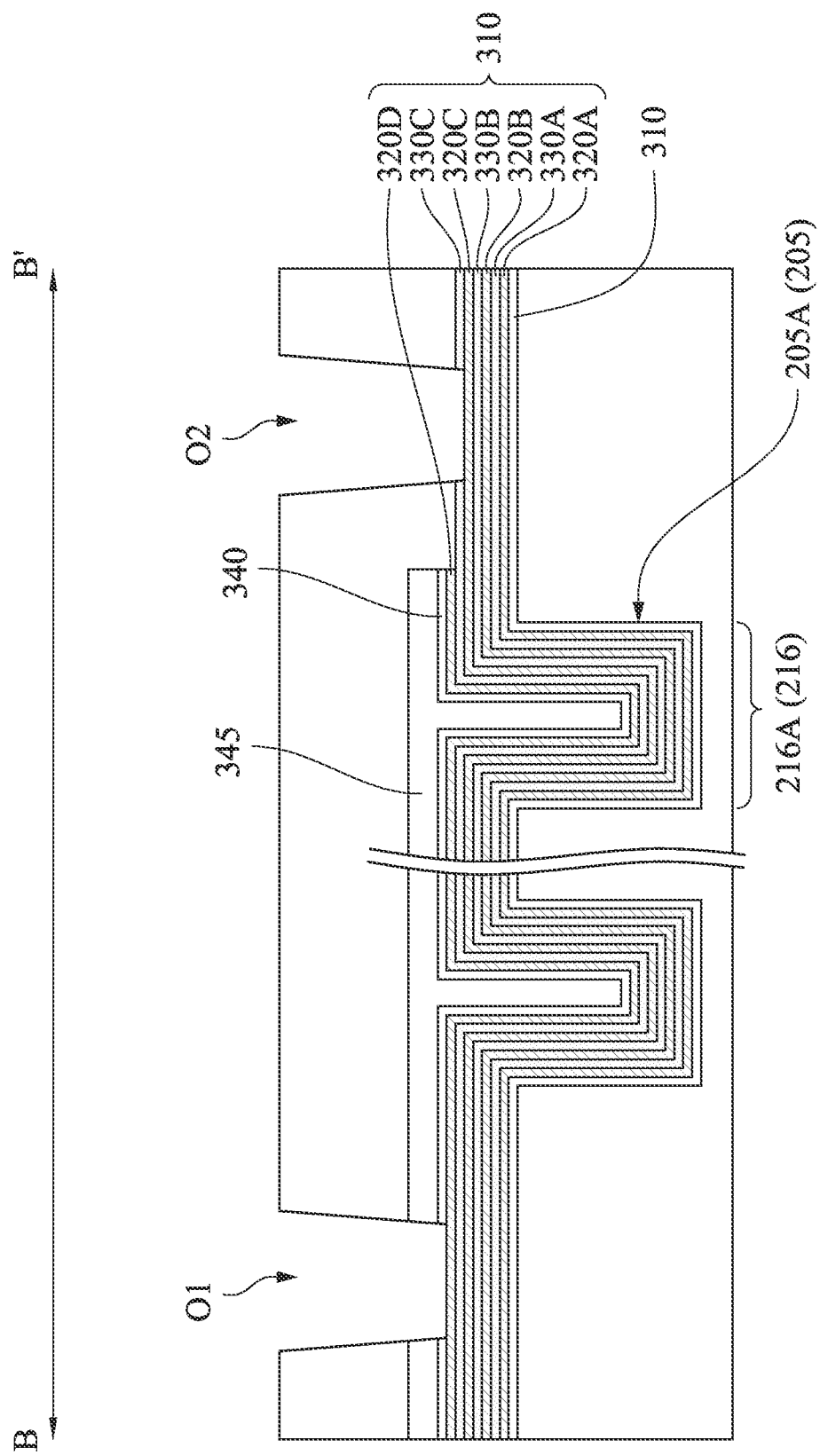
Figure 7C:
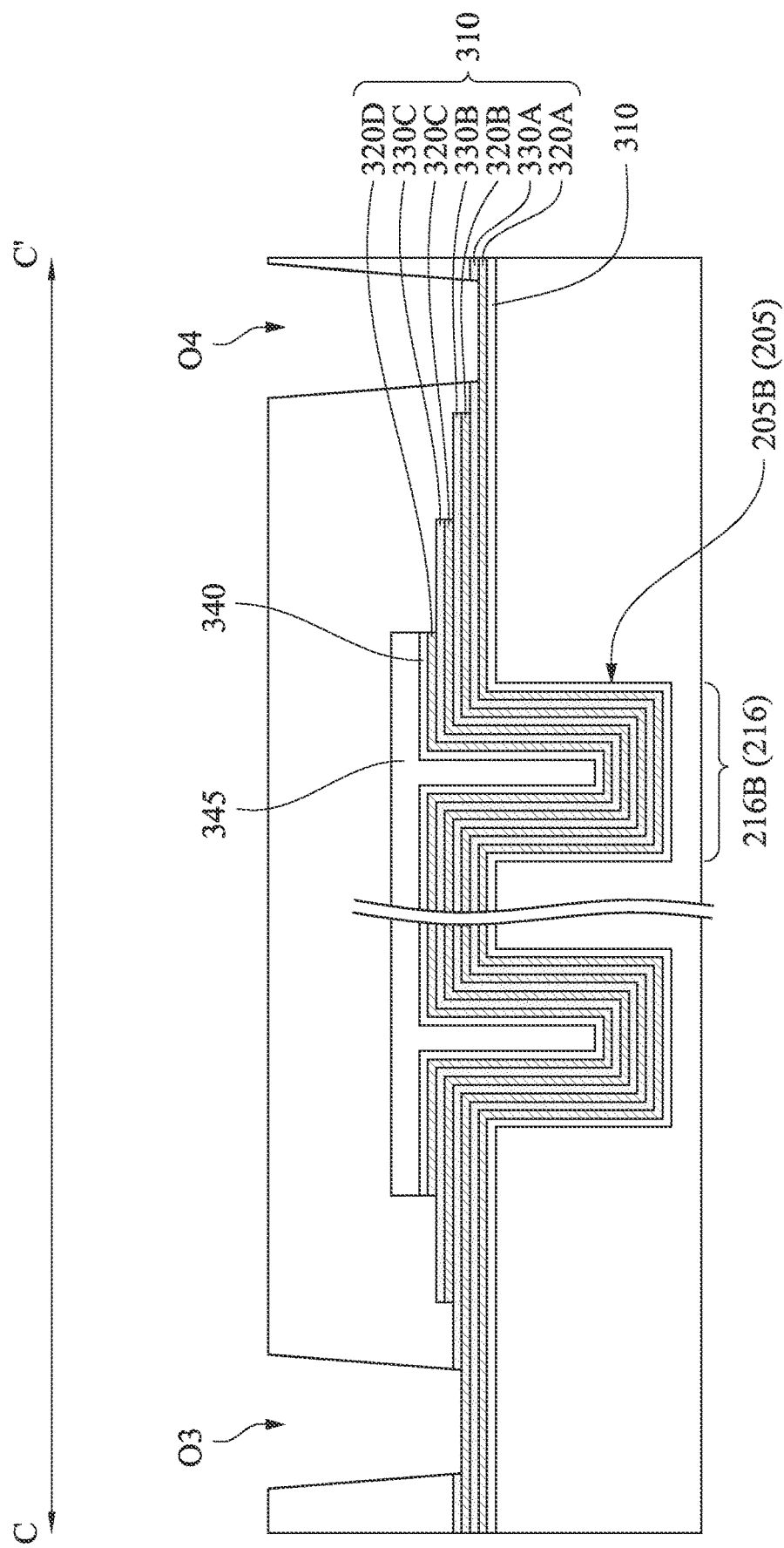

Reference is made to FIGS. 7A to 7C, in which FIG. 7A is a top view of a DTC structure, FIG. 7B is a cross-sectional view along line B-B of FIG. 7A, and FIG. 7C is a cross-sectional view along line C-C of FIG. 7A. A dielectric layer 350 is deposited over the substrate 200 and covering the capacitor structure 120. In some embodiments, the dielectric layer 350 may include a low-k dielectric material such as phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, and may be formed by any suitable method, such as spin-on coating, CVD, PECVD, ALD, a combination thereof, or the like.

The dielectric layer 350 is patterned to form openings O1, O2, O3, and O4 in the dielectric layer 350. In greater details, the openings O1 are formed in the dielectric layer 350, extending through the capping dielectric material layer 340 and the dielectric fill material layer 345, and exposing the metallic electrode layer 320D. The openings O2 are formed in the dielectric layer 350, extending through the node dielectric layer 330C, and exposing the metallic electrode layer 320C. The openings O3 are formed in the dielectric layer 350, extending through the node dielectric layer 330B, and exposing the metallic electrode layer 320B. The openings O4 are formed in the dielectric layer 350, extending through the node dielectric layer 330A, and exposing the metallic electrode layer 320A.

As shown in the top view of FIG. 7A, each of the openings O1, O2, O3, and O4 may include a width W2 and a length L2. In some embodiments, the width W2 is in a range from about 10 nm to about 10000 nm, the length L2 is in a range from about 1 μm to about 20 μm. In some embodiments, each of the openings O1, O2, O3, and O4 has a rectangular top profile. That is, the length L2 of each of the openings O1, O2, O3, and O4 may be greater than the width W2 of each of the openings O1, O2, O3, and O4. In some embodiments, the length-to-width ratio (e.g., L2/W2) of each of the openings O1, O2, O3, and O4 may be in a range from about 100 to 2000.

In some embodiments, the length L2 of each of the openings O1, O2, O3, and O4 may be substantially equal to the length L1 of each of the deep trenches 205, or may be substantially equal to the length of the capacitor unit 216 filled in the corresponding deep trench 205. Here, the length L2 is substantially equal to the length L1 can be referred to as a difference between the length L2 and the length L1 is less than 10%.

In the top view of FIG. 7A, the opening O1 may laterally between a deep trench group 210A and a deep trench group 210B along the second direction (e.g., Y-direction). In some embodiments, the opening O1 may laterally overlap the closest deep trench group 210A and deep trench group 210B along the second direction (e.g., Y-direction). Similarly, the opening O2 may laterally between a deep trench group 210A and a deep trench group 210B along the second direction (e.g., Y-direction). In some embodiments, the opening O2 may laterally overlap the closest deep trench group 210A and deep trench group 210B along the second direction (e.g., Y-direction).

In the top view of FIG. 7A, the opening O3 may laterally between a deep trench group 210A and a deep trench group 210B along the first direction (e.g., X-direction). In some embodiments, the opening O3 may laterally overlap the deep trench group 210A and deep trench group 210B, and an opening O1 (or an opening O2) along the first direction (e.g., X-direction), in which the opening O1 (or an opening O2) is laterally between the deep trench group 210A and the deep trench group 210B along the second direction (e.g., Y-direction). Similarly, the opening O4 may laterally overlap the deep trench group 210A and deep trench group 210B, and an opening O1 (or an opening O2) along the first direction (e.g., X-direction), in which the opening O1 (or an opening O2) is laterally between the deep trench group 210A and the deep trench group 210B along the second direction (e.g., Y-direction).

Figure 8A:
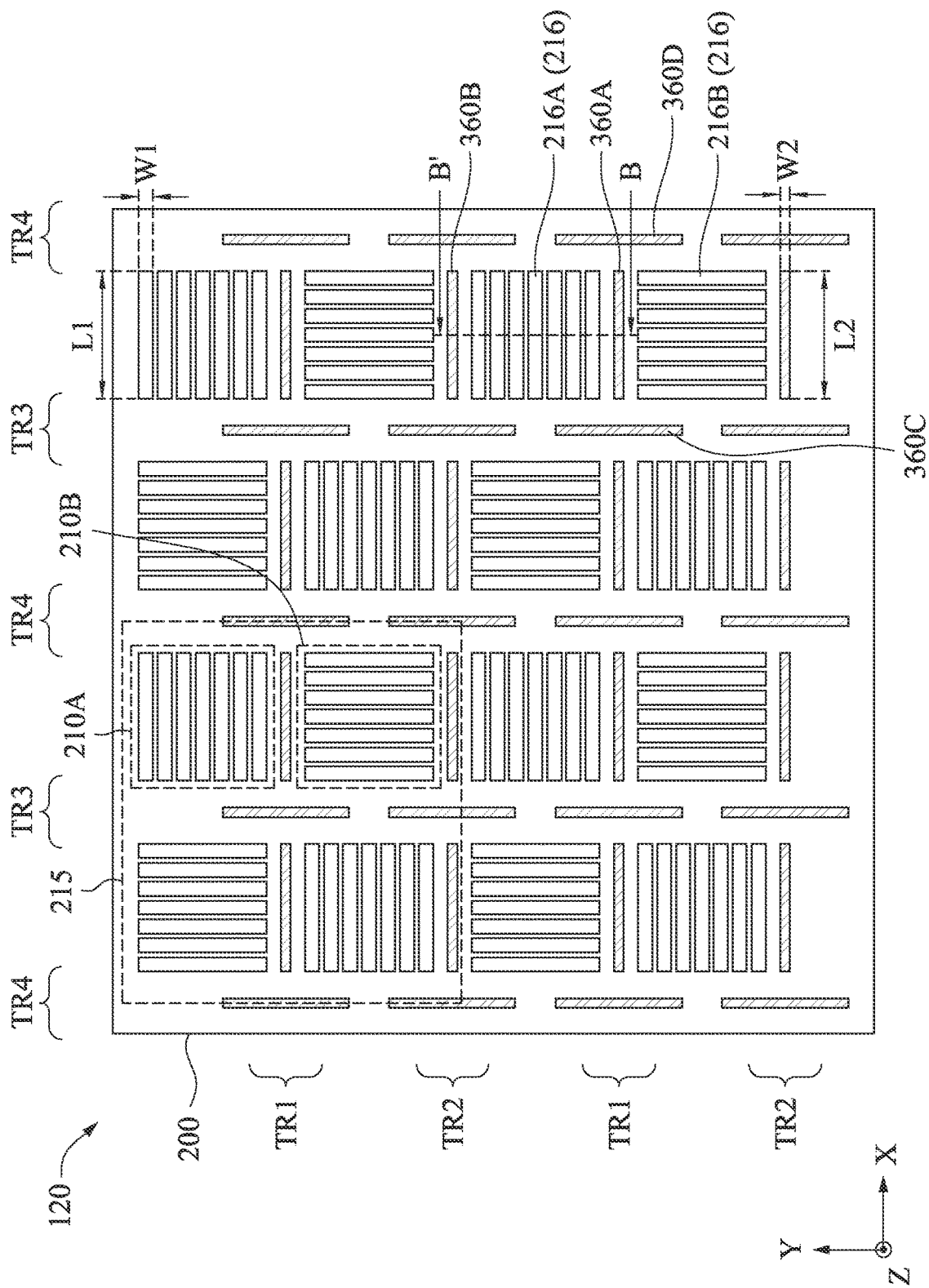
Figure 8B:
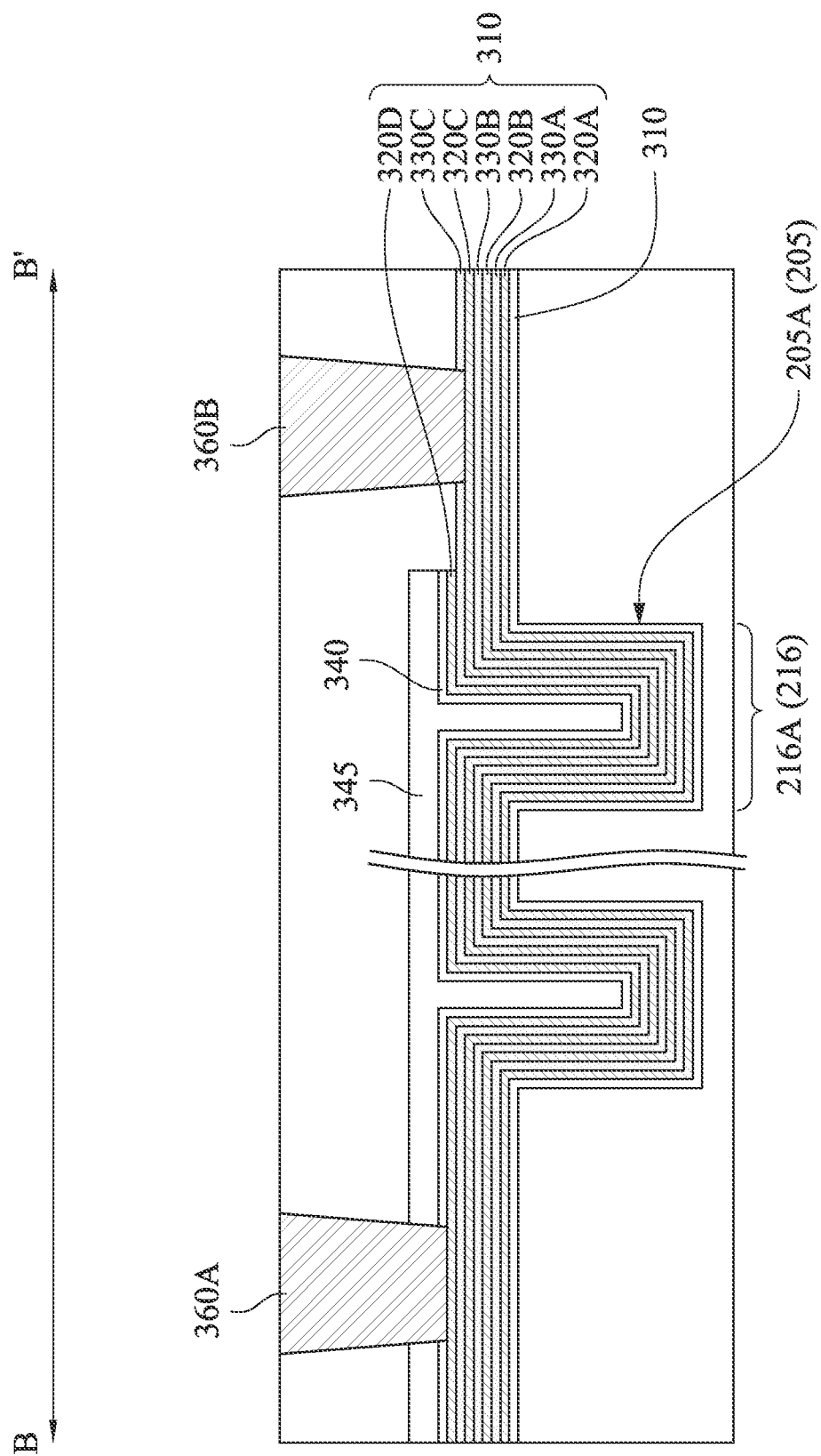
Figure 8C:
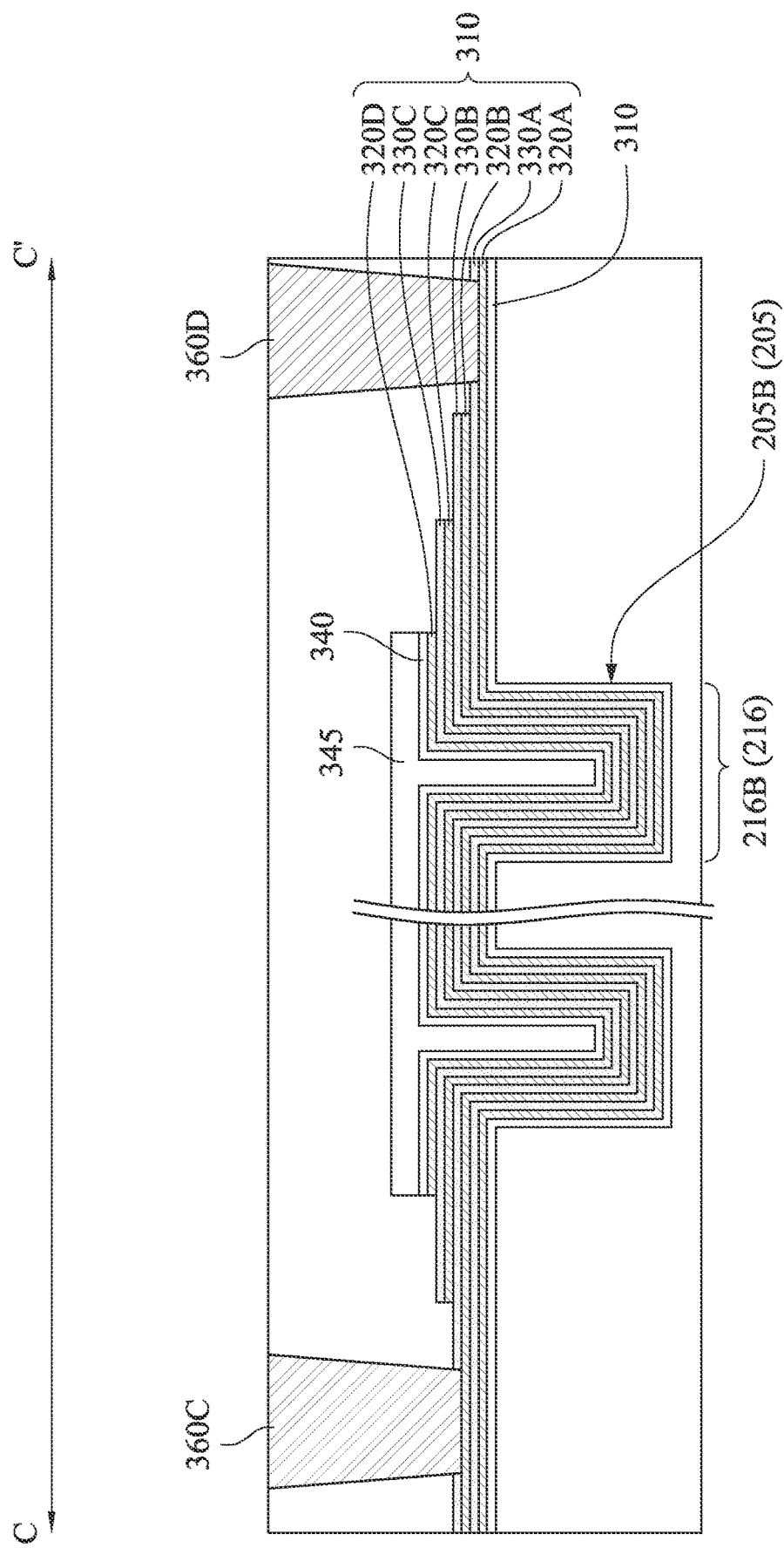

Reference is made to FIGS. 8A to 8C, in which FIG. 8A is a top view of a DTC structure, FIG. 8B is a cross-sectional view along line B-B of FIG. 8A, and FIG. 8C is a cross-sectional view along line C-C of FIG. 8A. Metal vias 360A, 360b, 360C, and 360D are formed in the openings O1, O2, O3, and O4, respectively. In greater details, the metal vias 360A are in contact with the metallic electrode layer 320D, the metal vias 360B are in contact with the metallic electrode layer 320C, the metal vias 360C are in contact with the metallic electrode layer 320B, and the metal vias 360A are in contact with the metallic electrode layer 320A, respectively.

In some embodiments, the metal vias 360A, 360B, 360C, and 360D can be formed by depositing one or more barrier/adhesion layers (not shown) in the openings O1, O2, O3, and O4, depositing seed layers (not shown) over the one or more barrier/adhesion layers, and filling the openings with a conductive material. A chemical mechanical polishing (CMP) is then performed to remove excess materials of the one or more barrier/adhesion layers, the seed layers, and the conductive material overfilling the openings. In some embodiments, the one or more barrier/adhesion layers may comprise titanium, titanium nitride, tantalum, tantalum nitride, a combination thereof, or the like, and may be formed using PVD, CVD, ALD, a combination thereof, or the like. The seed layers may comprise copper, titanium, nickel, gold, manganese, a combination thereof, or the like, and may be formed by plating, ALD, CVD, PVD, sputtering, a combination thereof; or the like. The conductive material may comprise copper, aluminum, tungsten, combinations thereof, alloys thereof, or the like, and may be formed using, for example, by plating, or other suitable methods.

In the top view of FIG. 8A, the metal via 360A may laterally between a deep trench group 210A and a deep trench group 210B along the second direction (e.g., Y-direction). In some embodiments, the metal via 360A may laterally overlap the closest deep trench group 210A and deep trench group 210B along the second direction (e.g., Y-direction). Similarly, the metal via 360B may laterally between a deep trench group 210A and a deep trench group 210B along the second direction (e.g., Y-direction). In some embodiments, the metal via 360B may laterally overlap the closest deep trench group 210A and deep trench group 210B along the second direction (e.g., Y-direction).

In the top view of FIG. 8A, the metal via 360C may laterally between a deep trench group 210A and a deep trench group 210B along the first direction (e.g., X-direction). In some embodiments, the metal via 360C may laterally overlap the deep trench group 210A and deep trench group 210B, and an metal via 360A (or an metal via 360B) along the first direction (e.g., X-direction), in which the metal via 360A (or an metal via 360B) is laterally between the deep trench group 210A and the deep trench group 210B along the second direction (e.g., Y-direction). Similarly, the metal via 360D may laterally overlap the deep trench group 210A and deep trench group 210B, and an metal via 360A (or an metal via 360B) along the first direction (e.g., X-direction), in which the metal via 360A (or an metal via 360B) is laterally between the deep trench group 210A and the deep trench group 210B along the second direction (e.g., Y-direction).

In the top view of FIG. 8A, there are tracks TR1 and TR2 alternately arranged along the second direction (e.g., Y-direction). In greater details, the tracks TR1 and TR2 can be referred to as the region that are laterally between one deep trench group 210A and one deep trench group 210B along the second direction (e.g., Y-direction). In some embodiments, all of the metal vias in the tracks TR1 are metal vias 360A. That is, all of the metal vias in the tracks TR1 are in contact with the metallic electrode layer 320D of the DTC structure 120. In some embodiments, all of the metal vias in the tracks TR2 are metal vias 360B. That is, all of the metal vias in the tracks TR2 are in contact with the metallic electrode layer 320C of the DTC structure 120. With such configuration, routing design can be simplified.

Similarly, there are tracks TR3 and TR4 alternately arranged along the first direction (e.g., X-direction). In greater details, the tracks TR3 and TR4 can be referred to as the region that are laterally between one deep trench group 210A and one deep trench group 210B along the first direction (e.g., X-direction). In some embodiments, all of the metal vias in the tracks TR3 are metal vias 360B. That is, all of the metal vias in the tracks TR3 are in contact with the metallic electrode layer 320B of the DTC structure 120. In some embodiments, all of the metal vias in the tracks TR4 are metal vias 360D. That is, all of the metal vias in the tracks TR4 are in contact with the metallic electrode layer 320A of the DTC structure 120. With such configuration, routing design can be simplified.

Figure 9A:
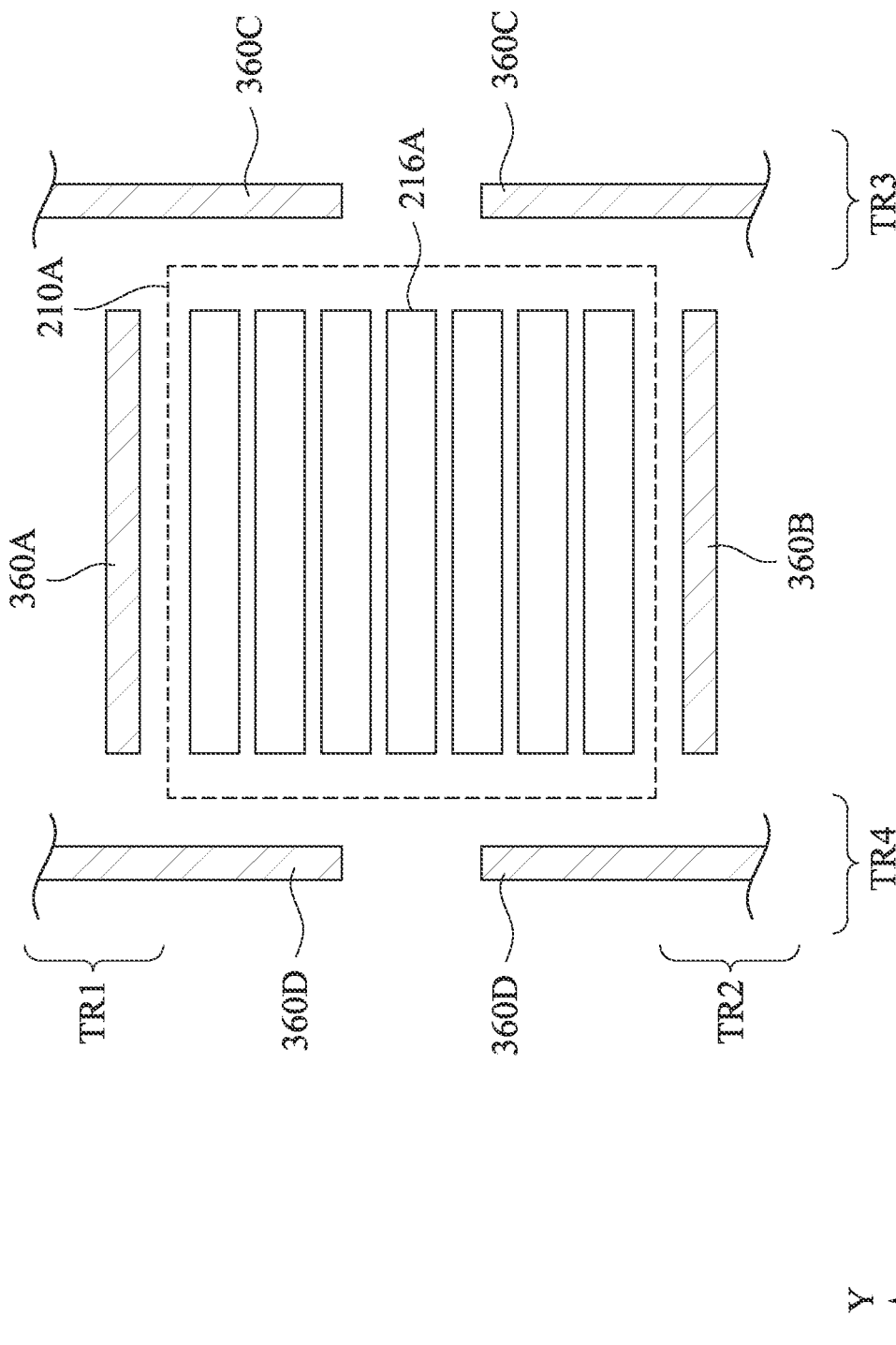
FIGS. 9A and 9B are top views of a deep-trench-capacitor (DTC) structure in accordance with some embodiments of the present disclosure.
Figure 9B:
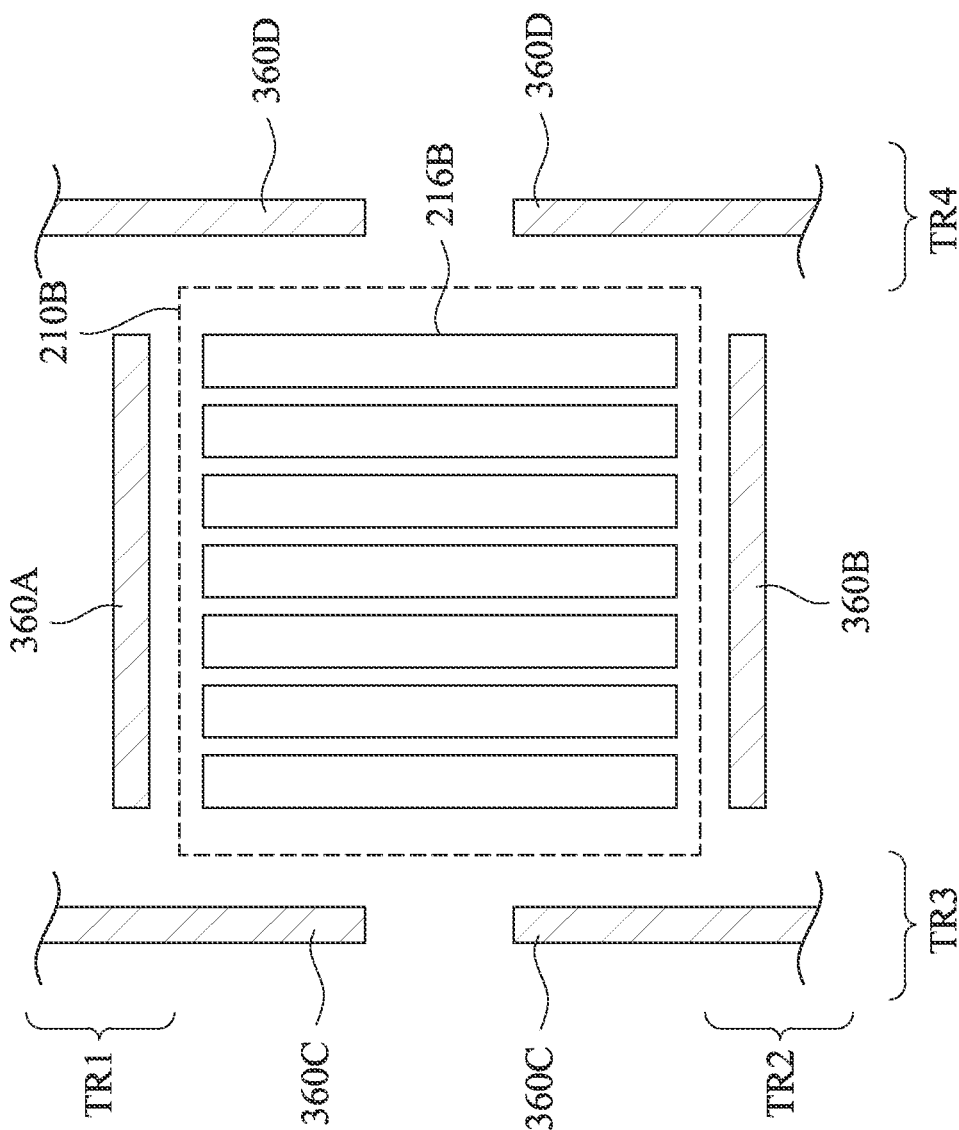

FIGS. 9A and 9B are top views of a deep-trench-capacitor (DTC) structure in accordance with some embodiments of the present disclosure. In greater details, FIG. 9A is an enlarged view with respect to a deep trench group 210A as described in FIG. 8A, and FIG. 9B is an enlarged view with respect to a deep trench group 210B as described in FIG. 8A.

Reference is made to FIG. 9A. Shown there is a deep trench group 210A, in which the deep trench group 210A includes the capacitor units 216A of the DTC structure 120. In some embodiments, a track TR1 is on the top side of the deep trench group 210A, a track TR2 is on the bottom side of the deep trench group 210A, a track TR3 is on the right side of the deep trench group 210A, and a track TR4 is on the left side of the deep trench group 210A. In some embodiments, only the metal via 360A is disposed in the track TR1, and only the metal via 360B is disposed in the track TR2. Accordingly, the capacitor units 216A of the deep trench group 210A may be laterally aligned with single metal via 360A in the track TR1 along the second direction (e.g., Y-direction), and may be laterally aligned with single metal via 360B in the track TR2 along the second direction (e.g., Y-direction).

In contrast, there are two metal vias 360C in the disposed in the track TR3, and two metal vias 360D in the disposed in the track TR4. Accordingly, the capacitor units 216A of the deep trench group 210A may laterally overlap two metal vias 360C in the track TR3 along the first direction (e.g., X-direction), and may laterally overlap two metal vias 360D in the track TR4 along the first direction (e.g., X-direction).

Reference is made to FIG. 9B. Shown there is a deep trench group 210B, in which the deep trench group 210B includes the capacitor units 216B of the DTC structure 120. In some embodiments, a track TR1 is on the top side of the deep trench group 210A, a track TR2 is on the bottom side of the deep trench group 210A, a track TR3 is on the left side of the deep trench group 210A, and a track TR4 is on the right side of the deep trench group 210A. In some embodiments, only the metal via 360A is disposed in the track TR1, and only the metal via 360B is disposed in the track TR2. Accordingly, the capacitor units 216A of the deep trench group 210A may laterally overlap single metal via 360A in the track TR1 along the second direction (e.g., Y-direction), and may laterally overlap single metal via 360B in the track TR2 along the second direction (e.g., Y-direction).

In contrast, there are two metal vias 360C in the disposed in the track TR3, and two metal vias 360D in the disposed in the track TR4. Accordingly, the capacitor units 216A of the deep trench group 210A may laterally overlap two metal vias 360C in the track TR3 along the first direction (e.g., X-direction), and may laterally overlap two metal vias 360D in the track TR4 along the first direction (e.g., X-direction).

Based on the above discussions, it can be seen that the present disclosure offers advantages. It is understood, however, that other embodiments may offer additional advantages, and not all advantages are necessarily disclosed herein, and that no particular advantage is required for all embodiments. Embodiments of the disclosure provide a semiconductor structure including a DTC structure, in which metal vias connected to the DTC structure may include a rectangular top profile, in which a length of the metal vias is greater than a width of the metal vias. In some embodiments, the length of the metal vias may be substantially equal to a length of a DTC unit of the DTC structure. With such configuration, the resistance of the semiconductor structure can be reduced, and manufacturing yield of the semiconductor structure can also be improved.

In some embodiments of the present disclosure, a method includes forming first-type deep trenches and second-type deep trenches in a substrate, in which the first-type deep trenches have a first lengthwise direction along a first direction and the second-type deep trenches have a second lengthwise direction along a second direction perpendicular to the first direction, and in which first groups of the first-type deep trenches and second groups of the second-type deep trenches laterally alternate along the first and second direction; forming a capacitor structure over the substrate and in the first-type deep trenches and the second-type deep trenches, in which the capacitor structure includes a first metallic electrode layer, a node dielectric layer over the first metallic electrode layer, and a second metallic electrode layer over the node dielectric layer; and forming a first metal via over the capacitor structure and in contact with the second metallic electrode layer of the capacitor structure, in which a length of the first metal via is greater than a width of the first metal via from a top view.

In some embodiments, a ratio of the length of the first metal via to the width of the first metal via is in a range from about 100 to about 2000.

In some embodiments, the length of the first metal via is substantially equal to a length of the first-type deep trenches.

In some embodiments, the first metal via is laterally between one of the first groups of the first-type deep trenches and one of the second groups of the second-type deep trenches along the second direction, and a lengthwise direction of the first metal via is along the first direction.

In some embodiments, along the second direction, the first metal via is laterally aligned with one of the first-type deep trenches.

In some embodiments, the method further includes forming a second metal via over the capacitor structure and in contact with the first metallic electrode layer of the capacitor structure, in which a lengthwise direction of the second metal via is along the second direction, and a length of the second metal via is greater than a width of the second metal via from the top view.

In some embodiments, along the first direction, the second metal via laterally overlaps the one of the first groups of the first-type deep trenches, the one of the second groups of the second-type deep trenches, and the first metal via.

In some embodiments, the method further includes patterning the second metallic electrode layer to expose portion of the node dielectric layer, in which the second metal via is formed through the portion of the node dielectric layer.

In some embodiments of the present disclosure, a method includes forming a group of deep trenches in a substrate, in which the deep trenches are arranged along a first direction, and the deep trenches have a lengthwise direction along a second direction perpendicular to the first direction; forming a capacitor structure over the substrate and in the deep trenches, in which forming the capacitor structure includes depositing a first metallic layer over the substrate and lining the deep trenches; depositing a node dielectric layer over the first metallic layer; and depositing a second metallic layer over the node dielectric layer; forming a dielectric layer over the capacitor structure; patterning the dielectric layer to form a first opening exposing the second metallic layer, in which a length of the first opening is substantially equal to a length of the deep trenches; and forming a first metal via in the first opening.

In some embodiments, a ratio of the length of the first opening to a width of the first opening is in a range from about 100 to about 2000.

In some embodiments, the first opening is laterally aligned with one of the deep trenches.

In some embodiments, patterning the dielectric layer further includes forming a second opening in the dielectric layer that exposes the first metallic layer of the capacitor structure, the second opening laterally overlapping the first opening and parts of the deep trenches, and the method further includes forming a second metal via in the second opening.

In some embodiments, patterning the dielectric layer further includes forming a second opening in the dielectric layer that exposes the first metallic layer of the capacitor structure, the second opening being laterally aligned with the first opening, and the method further includes forming a second metal via in the second opening.

In some embodiments, the capacitor structure has a staircase structure over a top surface of the substrate.

In some embodiments, outermost deep trenches of the group of deep trenches have a depth less than a depth of other deep trenches of the group of deep trenches.

In some embodiments of the present disclosure, a semiconductor structure includes a substrate, a capacitor structure, and a first metal via. The capacitor structure is over the substrate, in which the capacitor structure includes a group of capacitor units extending into the substrate, the capacitor units are arranged along a first direction, and the capacitor units have a lengthwise direction along a second direction perpendicular to the first direction. The capacitor structure includes a first metallic electrode layer, a node dielectric layer over the first metallic electrode layer, and a second metallic electrode layer over the node dielectric layer. The first metal via is over the capacitor structure and in contact with the second metallic electrode layer of the capacitor structure, in which a length of the first metal via is greater than a width of the first metal via from a top view.

In some embodiments, a ratio of the length of the first metal via to the width of the first metal via is in a range from about 100 to about 2000.

In some embodiments, the length of the first metal via is substantially equal to a length of the capacitor units.

In some embodiments, the first metal via is laterally aligned with the capacitor units.

In some embodiments, a lengthwise direction of the first metal via is along the second direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming first-type deep trenches and second-type deep trenches in a substrate, wherein the first-type deep trenches have a first lengthwise direction along a first direction and the second-type deep trenches have a second lengthwise direction along a second direction perpendicular to the first direction, and wherein first groups of the first-type deep trenches and second groups of the second-type deep trenches laterally alternate along the first and second direction;
    forming a capacitor structure over the substrate and in the first-type deep trenches and the second-type deep trenches, wherein the capacitor structure comprises:
        a first metallic electrode layer;
        a node dielectric layer over the first metallic electrode layer; and
        a second metallic electrode layer over the node dielectric layer; and
    forming a first metal via over the capacitor structure and in contact with the second metallic electrode layer of the capacitor structure, wherein a length of the first metal via is greater than a width of the first metal via from a top view, and a ratio of the length of the first metal via to the width of the first metal via is in a range from about 100 to about 2000.

2. The method of claim 1, wherein the length of the first metal via is substantially equal to a length of the first-type deep trenches.

3. The method of claim 1, wherein the first metal via is laterally between one of the first groups of the first-type deep trenches and one of the second groups of the second-type deep trenches along the second direction, and a lengthwise direction of the first metal via is along the first direction.

4. The method of claim 3, wherein along the second direction, the first metal via is laterally aligned with one of the first-type deep trenches.

5. The method of claim 3, further comprising:
    forming a second metal via over the capacitor structure and in contact with the first metallic electrode layer of the capacitor structure, wherein a lengthwise direction of the second metal via is along the second direction, and a length of the second metal via is greater than a width of the second metal via from the top view.

6. The method of claim 5, wherein along the first direction, the second metal via laterally overlaps the one of the first groups of the first-type deep trenches, the one of the second groups of the second-type deep trenches, and the first metal via.

7. The method of claim 5, further comprising patterning the second metallic electrode layer to expose portion of the node dielectric layer, wherein the second metal via is formed through the portion of the node dielectric layer.

8. A method, comprising:
    forming a group of deep trenches in a substrate, wherein the deep trenches are arranged along a first direction, and the deep trenches have a lengthwise direction along a second direction perpendicular to the first direction;

forming a capacitor structure over the substrate and in the deep trenches, wherein forming the capacitor structure comprises:
  depositing a first metallic layer over the substrate and lining the deep trenches;
  depositing a node dielectric layer over the first metallic layer; and
  depositing a second metallic layer over the node dielectric layer;
forming a dielectric layer over the capacitor structure;
patterning the dielectric layer to form a first opening exposing the second metallic layer, wherein a length of the first opening is substantially equal to a length of the deep trenches; and
forming a first metal via in the first opening.

9. The method of claim 8, wherein a ratio of the length of the first opening to a width of the first opening is in a range from about 100 to about 2000.

10. The method of claim 8, wherein the first opening is laterally aligned with one of the deep trenches.

11. The method of claim 8, wherein patterning the dielectric layer further comprises forming a second opening in the dielectric layer that exposes the first metallic layer of the capacitor structure, the second opening laterally overlapping the first opening and parts of the deep trenches, and the method further comprises forming a second metal via in the second opening.

12. The method of claim 8, wherein patterning the dielectric layer further comprises forming a second opening in the dielectric layer that exposes the first metallic layer of the capacitor structure, the second opening being laterally aligned with the first opening, and the method further comprises forming a second metal via in the second opening.

13. The method of claim 8, wherein the capacitor structure has a staircase structure over a top surface of the substrate.

14. The method of claim 8, wherein outermost deep trenches of the group of deep trenches have a depth less than a depth of other deep trenches of the group of deep trenches.

15. A method, comprising:
forming a capacitor structure over a substrate, wherein the capacitor structure comprises a group of capacitor units extending into the substrate, the capacitor units are arranged along a first direction, and the capacitor units have a lengthwise direction along a second direction perpendicular to the first direction, wherein the capacitor structure comprises:
  a first metallic electrode layer;
  a node dielectric layer over the first metallic electrode layer; and
  a second metallic electrode layer over the node dielectric layer; and
forming a first metal via over the capacitor structure and in contact with the second metallic electrode layer of the capacitor structure, wherein a length of the first metal via is greater than a width of the first metal via from a top view, and a ratio of the length of the first metal via to the width of the first metal via is in a range from about 100 to about 2000.

16. The method of claim 15, wherein the length of the first metal via is substantially equal to a length of the capacitor units.

17. The method of claim 15, wherein the first metal via is laterally aligned with the capacitor units.

18. The method of claim 15, wherein a lengthwise direction of the first metal via is along the second direction.

19. The method of claim 15, wherein one of the first metallic electrode layer and the second metallic electrode layer has a thickness in a range from 5 nm to 50 nm.

20. The method of claim 15, wherein the node dielectric layer has a thickness in a range from 1 nm to 20 nm.

* * * * *